(12) United States Patent
Matsutani et al.

(10) Patent No.: US 8,362,199 B2
(45) Date of Patent: Jan. 29, 2013

(54) BORAZINE-BASED RESIN, PROCESS FOR ITS PRODUCTION, BORAZINE-BASED RESIN COMPOSITION, INSULATING FILM AND METHOD FOR ITS FORMATION

(75) Inventors: Hiroshi Matsutani, Hitachi (JP); Makoto Kaji, Hitachi (JP); Koichi Abe, Hitachi (JP); Yuko Uchimaru, Tsukuba (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 410 days.

(21) Appl. No.: 12/475,849

(22) Filed: Jun. 1, 2009

(65) Prior Publication Data

US 2009/0240017 A1 Sep. 24, 2009

Related U.S. Application Data

(62) Division of application No. 10/529,369, filed on Oct. 5, 2005.

(30) Foreign Application Priority Data

| Sep. 26, 2002 | (JP) | P2002-281989 |
| Sep. 26, 2002 | (JP) | P2002-282004 |
| Sep. 26, 2002 | (JP) | P2002-282005 |
| Sep. 26, 2002 | (JP) | P2002-282043 |
| Sep. 9, 2003 | (JP) | P2003-317566 |
| Sep. 9, 2003 | (JP) | P2003-317568 |
| Sep. 9, 2003 | (JP) | P2003-317572 |
| Sep. 9, 2003 | (JP) | P2003-317573 |

(51) Int. Cl.
 *C08C 2/04* (2006.01)
(52) U.S. Cl. ............ 528/482; 423/6; 423/7; 423/22; 502/405; 528/7; 528/25; 528/31
(58) Field of Classification Search .................. None
 See application file for complete search history.

(56) References Cited

U.S. PATENT DOCUMENTS

| 4,503,106 A | 3/1985 | Cogliano |
| 4,503,160 A | 3/1985 | Williams |
| 5,115,069 A | 5/1992 | Motegi et al. |
| 5,179,188 A | 1/1993 | Mercer et al. |
| 5,187,134 A | 2/1993 | Panster et al. |
| 5,677,410 A | 10/1997 | Mager et al. |
| 6,013,187 A * | 1/2000 | Burns et al. ............ 210/688 |
| 6,087,523 A | 7/2000 | Bank et al. |
| 6,100,408 A | 8/2000 | Monkiewicz et al. |
| 6,376,601 B1 | 4/2002 | Kobayashi et al. |
| 7,064,168 B2 * | 6/2006 | Benz et al. ............ 525/326.9 |
| 2002/0035216 A1 * | 3/2002 | Klipper et al. ............ 525/351 |
| 2003/0224156 A1 | 12/2003 | Kirner et al. |
| 2005/0004248 A1 * | 1/2005 | Cotting et al. ............ 522/31 |

FOREIGN PATENT DOCUMENTS

| EP | 881678 | 12/1998 |
| JP | 02-255689 | 10/1990 |
| JP | 06-346025 | 12/1994 |
| JP | 10-209146 | 8/1998 |
| JP | 11-315083 | 11/1999 |
| JP | 2000-256466 | 9/2000 |
| JP | 2000-340689 | 12/2000 |
| JP | 2001-15496 | 1/2001 |
| JP | 2001-338978 | 12/2001 |
| JP | 2002-43308 | 2/2002 |
| JP | 2002-155143 | 5/2002 |
| JP | 2002-155144 | 5/2002 |
| JP | 2002-201416 | 7/2002 |
| JP | 2002-317049 | 10/2002 |
| JP | 2002-359240 | 12/2002 |

OTHER PUBLICATIONS

Abstract for CS 121972 (Feb. 1967).*
"Separation of Noble Metal Ions on Silica with Chemically-Bonded Ligands" authored by Schilling et al., and published in Mikrochimica Acta (1994) 116, 83-90.*
"Highly Selective Extraction of Platinum Group Metals with Silica-based (Poly)amine ion Exchangers Applied to Industrial Metal Refinery Effluents" authored by Kramer et al. and published in Hydrometallurgy (2002) 64, 59-68.*
Abstract for JP 06-001863 A (Jan. 11, 1994).*
Japanese Official Action issued Jan. 12, 2010, for Application No. 2003-317572.
M. Inoue, et al., "Application of Borazine-Si Organic/Inorganic Hybrid Polymer" *The Japan Society of Applied Physics*, Extended Abstracts (The 63$^{rd}$ Autumn Meeting), No. 2, Sep. 24, 2002, p. 765.
Japanese Official Action issued Jan. 26, 2010, for Application No. 2003-317573.
Japanese Official Action issued Jan. 26, 2010, for Application No. 2003-317566.
R. T. Paine, et al., "Synthetic Routes to Boron Nitride", *Chemical Review*, vol. 90, pp. 73-91 (1990).
R. T. Paine, et al., "Borazine-Based Polymers Close in on Commercial Performance", *Chem Tech*, pp. 29-37, Jul. 1994.
C. Kan, "Catalytic Behavior of Crosslinked Polystyrene Bound Platinum Complex in Hydrosilylation of Olefins", *Polymer Journal*, vol. 34, No. 3, pp. 97-102 (2002).
English Translation of International Preliminary Examination Report issued for International (PCT) Application No. PCT/JP2003/012357.
International Search Report dated Jan. 13, 2004, in connection with International (PCT) Application No. PCT/JP03/012357, filed Sep. 26, 2003.

(Continued)

*Primary Examiner* — Marc Zimmer
(74) *Attorney, Agent, or Firm* — Antonelli, Terry, Stout & Kraus, LLP.

(57) ABSTRACT

Interlayer insulating films 5,7 (insulating films) provided in a memory capacitor cell 8 are formed between a gate electrode 3 and a counter electrode 8C formed on a silicon wafer 1. The interlayer insulating films 5,7 comprise a borazine-based resin, having a specific dielectric constant of no greater than 2.6, a Young's modulus of 5 GPa or greater and a leak current of no greater than $1\times10^{-8}$ A/cm$^2$.

8 Claims, 9 Drawing Sheets

OTHER PUBLICATIONS

Uchimaru, et al., "Evaluation of Low-k Polymer Film Containing Borazine Unit" *Extended Abstracts, The Japan Society of Applied Physics and Related Societies* (62$^{nd}$ Autumn Meeting, Sep. 11-14, 2001), p. 656.

Inoue, et al., "Borazine-Siloxane Polymer and It's Application", *Proceedings of the Symposium on Semiconductors and Integrated Circuits Technology*, pp. 96-101 (2002).

Japanese Official Action issued Apr. 28, 2009, in Japanese Application No. 2003-317568.

Japanese Official Action issued May 12, 2009, in Japanese Application No. 2003-317572.

U.S. Office Action dated Aug. 8, 2012, for U.S. Appl. No. 13/219,342.

R. Drake, et al., "Remarkable activity, selectivity and stability of polymer-supported Pt catalyst in room temperature, solvent-less, alkene hydrosilylations", *Chem Comm*, 2000, pp. 1931 and 1932.

J. Haberecht, et al., "Functionalized borazine as precursors for new silica gels", *Dalton*, 2003, pp. 2126-2132.

* cited by examiner

BORAZINE-BASED RESIN, PROCESS FOR ITS PRODUCTION, BORAZINE-BASED RESIN COMPOSITION, INSULATING FILM AND METHOD FOR ITS FORMATION

This application is a Divisional application of prior application Ser. No. 10/529,369, filed Oct. 5, 2005, the contents of which are incorporated herein by reference in their entirety.

TECHNICAL FIELD

The present invention relates to a borazine-based resin and a process for its production, and to a borazine-based resin composition, an insulating film and a method for its formation.

BACKGROUND ART

The miniaturization, increased output and faster signal speeds of communication devices in recent years have led to greater flattening of films by CMP and increasing demands for greater heat resistance, mechanical properties, hygroscopicity, adhesion, moldability and high etching selection ratio, and particularly a low specific dielectric constant, for the insulating films (IMD: intermetal dielectrics, ILD: interlayer dielectrics, PMD: premetal dielectrics, etc.) of electronic products.

Most particularly, the micronization of wirings due required for increased integration of semiconductor electronic parts (devices) such as LSIs and the like has been accompanied by problems such as longer signal delay times as a result of increased interwiring capacities, and therefore efforts have been more actively directed toward achieving lower dielectric constants and shorter heat treatment steps, as well as greater heat resistance and mechanical properties of electronic part insulating materials. This is because, generally speaking, the wiring signal propagation speed (v) and the specific dielectric constant (∈) of an insulating material in contact with a wiring material are in the relationship represented by v=k/√∈ (where k is a constant), and therefore in order to increase the signal propagation speed to reduce the wiring delay it is necessary to either increase the frequency range used or absolutely minimize the specific dielectric constant of the insulating material.

Low dielectric constant materials currently being implemented as such insulating film materials for mass production include SiOF films (by CVD) having specific dielectric constants of about 3.5, while organic polymers such as organic SOG (Spin On Glass) having specific dielectric constants of 2.6-3.0 are also being investigated. Porous materials with pores in the films have also been proposed as insulating film materials with even lower specific dielectric constants of less than 2.6, and research is actively progressing towards their application for LSI interlayer insulating films.

Another low dielectric constant material is borazine, having a molecular structure wherein benzene carbon atoms are replaced with nitrogen atoms and boron atoms, which is known to have a lower calculated dielectric constant than benzene. Borazine-containing silicon polymer thin-films are also known to have high heat resistance.

DISCLOSURE OF THE INVENTION

Still, insulating films having low dielectric constants achieved by conventional pore formation tend to also exhibit lower film strength with lower dielectric constant, and when such films are flattened by, for example, CMP (Chemical Mechanical Polishing), major inconveniences such as film peeling occur more readily, while the process adaptability and the reliability of the devices using the insulating films are impaired.

In addition, since a borazine-containing silicon polymer thin-film is produced by simple coating of a solution comprising a mixture of a B,B',B''-trialkynylborazine compound and a hydrosilyl group-containing silicon compound in the presence of a platinum catalyst, the platinum catalyst remains as an unavoidable impurity in the thin-film. Metallic impurities in an interlayer insulating film can cause leak current and reduce or impair the performance of the insulating film. It is therefore easy to imagine that when a borazine-containing silicon polymer thin-film is used as an interlayer insulating film, the platinum catalyst will act as a metallic impurity to produce leak current.

Materials applied for LSI interlayer insulating films must exhibit a low dielectric constant as well as excellent heat resistance and high adhesion. CMP is essential for global flattening in multilayer wiring processes for ultraminiature next-generation LSIs, and adhesion is an especially important factor for increasing the polishing resistance for CMP.

Yet, the aforementioned organic SOG, organic polymers and porous materials which are considered effective as low dielectric constant materials having specific dielectric constants of 3.0 or lower, while having lower dielectric constants than conventional $SiO_2$ films or SiOF films formed by CVD, also tend to have insufficient adhesion for upper layer films such as hard masks, which are required for trench (groove) working during wiring formation. Thus, easy peeling between upper layer films and insulating films composed of such low dielectric constant materials has been a problem in CMP processes, and consequently there has been a strong desire for improvement in the adhesion of low dielectric constant materials.

The present invention has been accomplished in light of the circumstances described above, and one of its objects is to provide an insulating film with adequately increased mechanical strength and electrical properties, as well as electronic parts which effectively prevent wiring delay while exhibiting mechanical strength and improved reliability.

It is another object of the invention to provide an insulating film having low metallic impurities and adequately minimized generation of leak current, as well as a process for its manufacture, a borazine-based resin composition that can be used to effectively form the insulating film, and a borazine-based resin as the main component of the borazine-based resin composition, as well as a process for its production. It is yet another object of the invention to provide electronic parts with minimal generation of leak current and adequate resistance to reduction or impairment of characteristics.

In order to achieve the objects stated above, the insulating film of the invention hereinafter referred to as "insulating film A") is characterized by comprising in its molecular structure a compound having a borazine skeleton (hereinafter referred to as "borazine compound"), and by having a specific dielectric constant of no greater than 2.6, a Young's modulus of 5 GPa or greater and a leak current of no greater than $1\times10^{-8}$ $A/cm^2$.

The insulating film A having this construction has a specific dielectric constant of no greater than 2.6, but does not require pore formation for such a low specific dielectric constant as is the case with conventional organic polymers. The reduction in film strength which occurs with pore formation can therefore be avoided. The insulating film A also has a Young's modulus of 5 GPa or greater, and the film therefore exhibits excellent mechanical properties and is highly suitable for flattening steps when the insulating film is used as in interlayer insulating film. In addition, the leak current of no greater than $1\times10^8$ A/cm$^2$ makes it possible to eliminate the risk of impaired device characteristics when the insulating film A is used as an interlayer insulating film, for example.

The insulating film A of the invention is preferably formed from a borazine-based resin composition with a metal impurity content of no greater than 30 ppm. If the metal impurity content of the borazine-based resin composition as the starting material is greater than 30 ppm, the insulating film of the invention may not be able to exhibit the required low specific dielectric constant, or the leak current may become significant, when it is used as an interlayer insulating film of a multilayer wiring in an ultraminiature structure, for example.

An electronic part according to the invention (hereinafter referred to as "electronic part A") is any electronic device such as a semiconductor device or liquid crystal device which is constructed using an insulating film according to the invention, or in other words, one provided with a conductive layer-formed substrate and an interlayer insulating film formed on the substrate and composed of an insulating film according to the invention.

A composite insulating film according to the invention ("hereinafter referred to simply as "composite insulating film") is one provided with a first insulating film comprising a siloxane resin (polysiloxane) and a second insulating film formed on the first insulating film and comprising a compound having a borazine skeleton in the molecular structure (a borazine compound).

Since the first insulating film in a composite insulating film having such a structure comprises a siloxane resin, it is easy to introduce pores into the film during formation of the resin from the starting solution, thereby allowing low dielectric constant to be achieved by pore formation. In addition, since the second insulating film formed thereover comprises a borazine skeleton in the molecular structure, it is possible to achieve a low dielectric constant for the film and therefore a lower dielectric constant for the composite insulating film as a whole. Moreover, since the dielectric constant of the second insulating film can be lower than the dielectric constant of the first insulating film, there is no need for excessive pore formation in the first insulating film. Consequently, the mechanical strength of the first insulating film, and therefore the composite insulating film as a whole, can be increased.

The second insulating film which comprises a borazine compound adheres very well to other layers, or in other words, it has very excellent adhesion with other layers. In a composite insulating film of the invention, the second insulating film which exhibits high adhesion is formed over the first insulating film, so that when an upper layer film such as a hard mask is formed on the composite insulating film, the upper layer film adheres to the second insulating film and forms a strong bond between them. A strong bond is also formed between the first insulating film and the second insulating film. Thus, the adhesion inside the composite insulating film and between the composite insulating film and upper layer film is increased, thereby helping to prevent layer peeling during CMP and other steps.

Specifically, the first insulating film is preferably one composed of a siloxane resin composition comprising a siloxane resin obtained by hydrolytic condensation of a compound represented by the following formula (1).

$$X^1{}_n SiX^2{}_{4-n} \quad (1)$$

In this formula, $X^1$ represents an H atom, an F atom, a group containing a B atom, N atom, Al atom, P atom, Si atom, Ge atom or Ti atom, or an organic group of 1 to 20 carbons, $X^2$ represents a hydrolyzable group, and n represents an integer of 0-2, with the proviso that when n is 2, each $X^1$ may be the same or different, and when n is 0-2, each $X^2$ may be the same or different.

The starting material for the first insulating film can be easily prepared as a solution by dissolving the compound represented by formula (1) in a solvent, and this may be coated and then heated to cause hydrolytic condensation and produce a siloxane resin while thermosetting it, thereby allowing the first insulating film to be easily formed. If a porous material, or a component which volatilizes at a lower temperature than the thermosetting temperature is added to the starting material, it will be possible to easily form fine pores in the first insulating film. If a component which aids dehydrating condensation reaction of the compound represented by formula (1) is added, it will be possible to reduce the Si—OH bonds and increase the density of siloxane bonds, while also promoting relaxation of stress in the first insulating film due to the higher densification of siloxane bonds and the annealing effect of thermosetting.

The borazine compound is preferably one having a repeating unit represented by the following formulas (2):

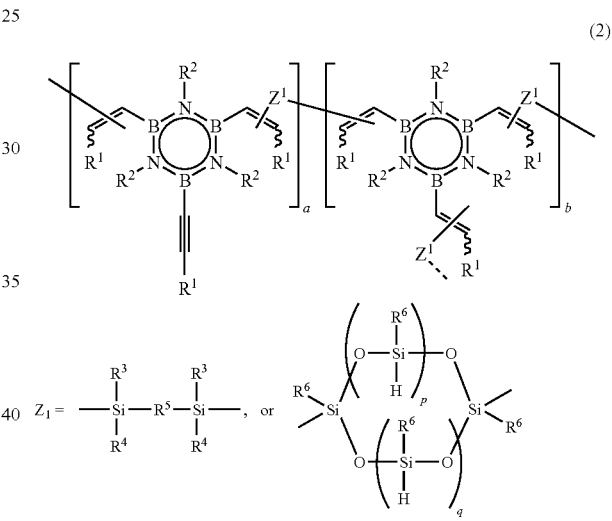

from the standpoint of the film forming property and chemical stability.

In these formulas, $R^1$ represents alkyl, aryl, aralkyl or hydrogen, $R^2$ represents alkyl, aryl, aralkyl or hydrogen, $R^3$ and $R^4$ represent identical or different monovalent groups selected from among alkyl, aryl, aralkyl and hydrogen, $R^5$ represents a substituted or unsubstituted aromatic divalent group, an oxypoly(dimethylsiloxy) group or oxygen, $R^6$ represents alkyl, aryl, aralkyl or hydrogen, a represents a positive integer, b represents 0 or a positive integer, p represents 0 or a positive integer, and q represents 0 or a positive integer.

Another electronic part according to the invention (hereinafter referred to as "electronic part B") comprises a composite insulating film of the invention on a substrate such as a silicon wafer. Also useful is a laminate (structure) wherein another upper film, such as a hard mask, anti-reflection (AR) film, reflection film, resist film or the like covers the second insulating film which contains a borazine skeleton in the molecular structure. Particularly useful are laminated bodies wherein the upper layer film is a hard mask, which is necessary for formation of the metal wiring pattern on the insulating film and which requires firm adhesion.

One process for production of a borazine-based resin according to the invention (hereinafter referred to as "first borazine-based resin production process") is a process for production of a borazine-based resin that is a polymer having a borazine skeleton on the main chain or a side chain (hereinafter referred to simply as "borazine-based resin"), the process being characterized by comprising a first step of polymerizing a B,B',B"-trialkynylborazine and a hydrosilane in the presence of a solid catalyst, and a second step of removing the solid catalyst after completing the first step.

In the first step of the first borazine-based resin production process, the B,B',B"-trialkynylborazine and hydrosilane are polymerized to form a borazine-based resin which is a borazine-containing silicon-based polymer, but since a solid catalyst is used as the catalyst, the catalyst can be very easily removed in the second step, with a low rate of residue. It is therefore possible to obtain a borazine-based resin with the metal component adequately eliminated.

The solid catalyst is preferably a supporting catalyst with the catalyst supported on a compound-based carrier. Using this type of catalyst will render filtration of the catalyst from the reaction system easier than when using a supporting catalyst having the catalyst supported on a non-compound-based carrier (for example, a platinum-carbon catalyst), in which it is difficult to increase the catalyst particle size, so that metallic impurities can be drastically reduced. It will also eliminate the risk of leak current resulting from conductivity of the carrier, a concern with catalysts which are supported on carbon-based carriers (for example, platinum-carbon catalysts).

Another process for production of a borazine-based resin according to the invention (hereinafter referred to as "first borazine-based resin production process") is a process for production of a borazine-based resin that is a polymer having a borazine skeleton on the main chain or a side chain (borazine-based resin), the process being characterized by comprising a first step of polymerizing a B,B',B"-trialkynylborazine and a hydrosilane in the presence of a metal catalyst in a polymerization solvent, a second step of adding to the polymerization system (polymer solution) a particulate scavenger which is insoluble in the polymerization system polymer solution) of the first step and adsorbs the metal component from the metal catalyst, after completion of the first step, and a third step of filtering out the scavenger to which the metal component has been adsorbed after completion of the second step.

In the first step of the second borazine-based resin production process, the B,B',B"-trialkynylborazine and hydrosilane are polymerized to form a borazine-based resin. At this point, the metal component of the metal catalyst still remains in the polymerization system (polymer solution), but addition of the particulate scavenger in the second step allows its separation and removal from the polymer solution. The scavenger onto which the metal component has adsorbed is particulate and insoluble in the polymer solution and can therefore be easily filtered out in the third step. This process yields a borazine-based resin from which the metal component has been adequately eliminated.

Using this type of scavenger allows the catalyst to be effectively recovered even when a homogeneous catalyst is used as the metal catalyst. Thus, a small amount of a homogeneous catalyst with high reactivity may be used for efficient reaction, and then recovered for easy reuse of the catalyst, thereby improving economy and promoting effective utilization of resources.

For the first and second borazine-based resin production processes, the B,B',B"-trialkynylborazine is preferably one represented by the following formula (3).

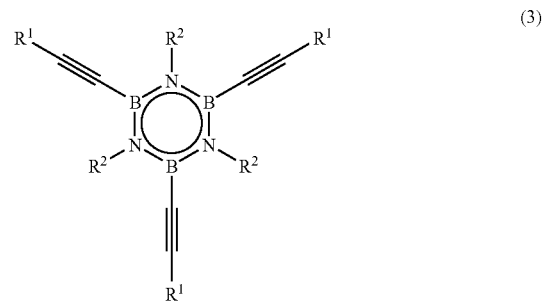

In this formula, $R^1$ represents alkyl, aryl, aralkyl or hydrogen, and $R^2$ represents alkyl, aryl, aralkyl or hydrogen.

More specifically, it is useful if the hydrosilane is one represented by the following formula (4):

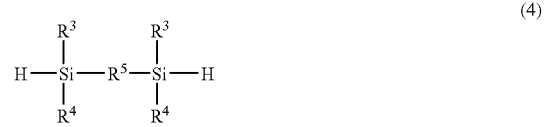

or the following formula (5).

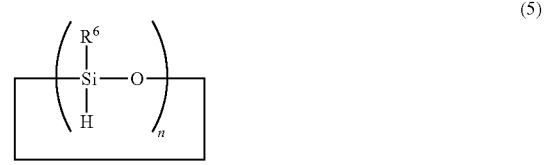

In these formulas, $R^3$ and $R^4$ represent identical or different monovalent groups selected from among alkyl, aryl, aralkyl and hydrogen, $R^5$ represents a substituted or unsubstituted aromatic divalent group, an oxypoly(dimethylsiloxy) group or oxygen, $R^6$ represents alkyl, aryl, aralkyl or hydrogen, and n represents an integer of 2 or greater.

A borazine-based resin composition of the invention is characterized by comprising a polymer with a borazine skeleton on the main chain or a side chain, and a solvent capable of dissolving the polymer, and by having a solid concentration of 0.5 wt % or greater (preferably with an upper limit of 80 wt %) and a metal impurity content of no greater than 30 ppm.

The polymer is preferably a borazine-based resin produced by the first or second borazine-based resin production process of the invention, in order to exhibit a low specific dielectric constant and facilitate coating onto bases such as semiconductor boards while dissolved in the solvent.

If the solid concentration of the borazine-based resin composition is less than 0.5 wt %, the thickness of the film obtained by a single coating onto the substrate will be small, and the reliability of the film, including its strength and heat resistance, as well as its insulating property when dried as an insulating film, will be reduced. If the metal impurity content exceeds 30 ppm, it may not be possible to achieve the low specific dielectric constant required when the borazine-based resin composition is used, for example, as a multilayer wiring interlayer insulating film in an ultraminiature structure, or the leak current may become significant, potentially impairing the properties of the element or other device. The "solid concentration" referred to here is the amount of residue components after drying off the solvent and other volatile components of the resin composition.

According to the first and second borazine-based resin production processes, the polymer preferably has a repeating unit represented by the following formula (2):

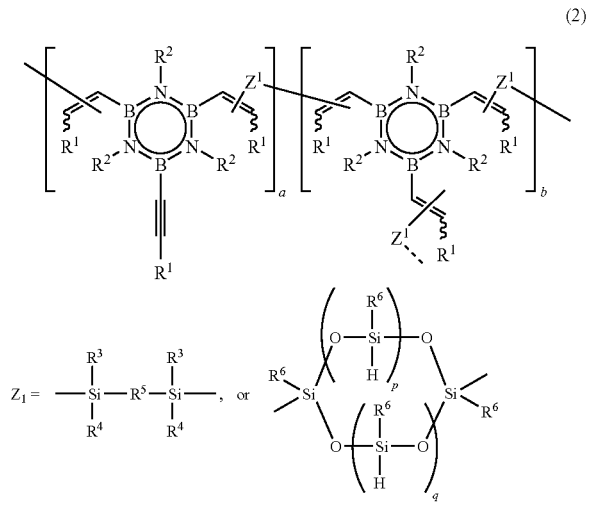

(2)

from the standpoint of film forming property and chemical stability.

In these formulas, $R^1$ represents alkyl, aryl, aralkyl or hydrogen, $R^2$ represents alkyl, aryl, aralkyl or hydrogen, $R^3$ and $R^4$ represent identical or different monovalent groups selected from among alkyl, aryl, aralkyl and hydrogen, $R^5$ represents a substituted or unsubstituted aromatic divalent group, an oxypoly(dimethylsiloxy) group or oxygen, $R^6$ represents alkyl, aryl, aralkyl or hydrogen, a represents a positive integer, b represents 0 or a positive integer, p represents 0 or a positive integer, and q represents 0 or a positive integer.

The method of forming an insulating film according to the invention is a method for forming an insulating film on a substrate, characterized in that the borazine-based resin composition is coated onto a substrate to form a coated film, and the coated film is then dried.

An insulating film according to the invention is formed on a substrate by the method of forming an insulating film of the invention, and it is particularly useful as a film formed between adjacent conductive layers among a plurality of conductive layers formed on a substrate, or in other words, as an interlayer insulating film which requires a satisfactory degree of reduction in leak current.

Another electronic part according to the invention (hereinafter referred to as "electronic part C") is an electronic part comprising an insulating film according to the invention, and it is used to construct an electronic device such as a semiconductor device or liquid crystal device.

Figure 1:
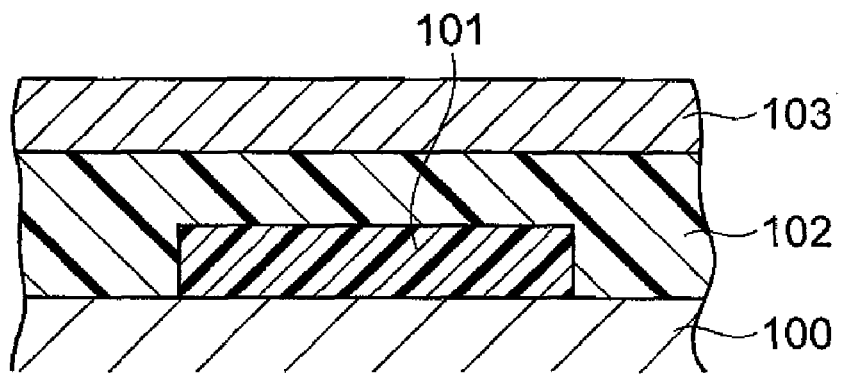
FIG. 1 is a schematic cross-sectional view showing an example of a composite insulating film according to the invention.

BEST MODES FOR CARRYING OUT THE INVENTION (Borazine Compounds and Borazine-Based Resins)

The insulating film A, i.e. the second insulating film in a composite insulating film, comprises a borazine compound, and the compound is preferably the same type of resin as a borazine-based resin obtained by the first and second borazine-based resin production processes.

The borazine-based resin may be a polymer having a substituted or unsubstituted borazine skeleton on the main chain or a side chain, and for example, there may be mentioned the polymers described in Chemical Review, Vol. 90, pp. 73-91 (1990) and CHEMTECH, July 1994, pp. 29-37. Specifically there are preferred polymers having at least one of the following repeating units.

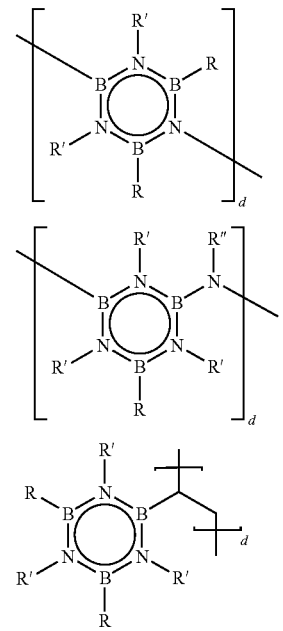

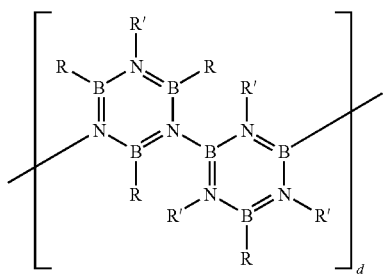
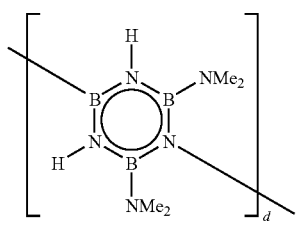
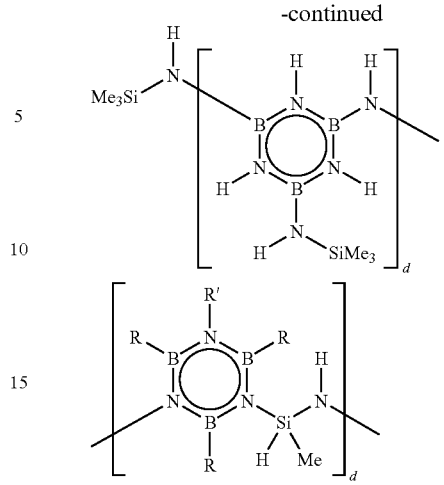
Here, R, R' and R" represent H, Me (—CH$_3$) or Ph (—C$_6$H$_5$), and d represents an integer of 2 or greater.
Borazine-based resins having repeating units represented by the following formulas (2) and (6) may be mentioned as even more preferred borazine-based resins, because of their excellent film forming property and chemical stability.
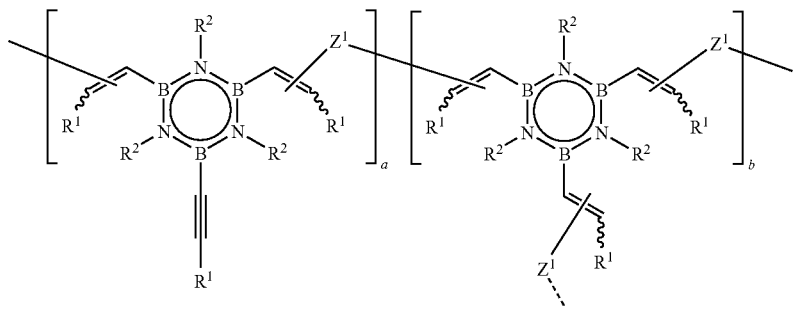
(2)
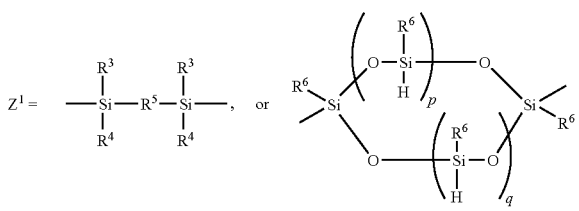
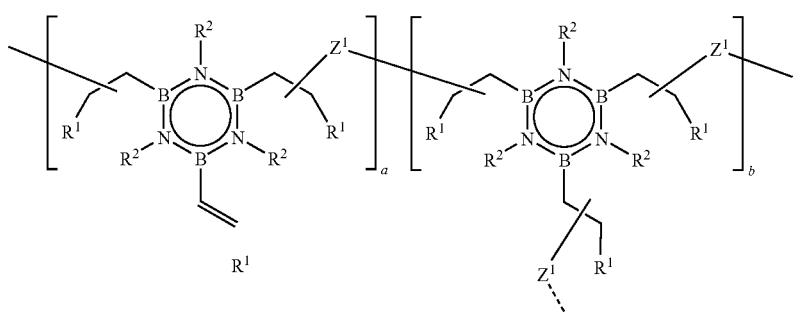
(6)

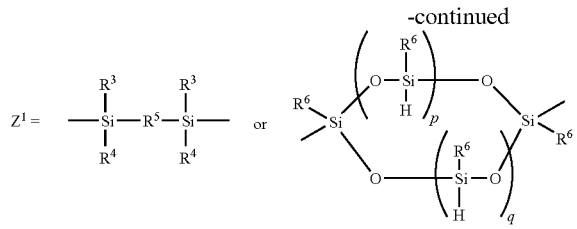

In formulas (2) and (6), the portion:

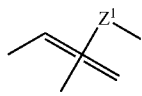

represents either of the following:

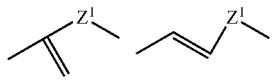

while the portion:

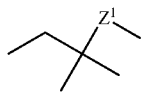

represents either of the following:

and the portion:

represents either of the following.

The dotted line in formula (2) means that a bond is formed with the carbon of the alkynyl group of the borazine residue, and the dotted line in formula (6) means that a bond is formed with the carbon of the alkenyl group of the borazine residue.

In formulas (2) and (6), $R^1$ represents alkyl aryl, aralkyl or hydrogen. The number of carbon atoms of the alkyl group is preferably 1-24 and more preferably 1-12. The number of carbon atoms of the aryl group is preferably 6-20 and more preferably 6-10. The number of carbon atoms of the aralkyl group is preferably 7-24 and more preferably 7-12. More specifically, for group $R^1$ there may be mentioned alkyl groups such as methyl, ethyl, isopropyl, t-butyl and octyl, aryl groups such as phenyl, naphthyl and biphenyl, aralkyl groups such as benzyl and phenethyl, and hydrogen, among which methyl, ethyl, phenyl and hydrogen are especially preferred.

Also in formulas (2) and (6), $R^2$ represents alkyl, aryl, aralkyl or hydrogen, and the number of carbon atoms of the alkyl group is preferably 1-24 and more preferably 1-12. The number of carbon atoms of the aryl group is preferably 6-20 and more preferably 6-10. The number of carbon atoms of the aralkyl group is preferably 7-24 and more preferably 7-12. More specifically, for group $R^2$ there may be mentioned alkyl groups such as methyl ethyl, isopropyl, t-butyl and octyl, aryl groups such as phenyl, naphthyl, biphenyl and anthracenyl, aralkyl groups such as benzyl, phenethyl and fluorenyl, and hydrogen, among which methyl: phenyl and hydrogen are especially preferred.

Also in formulas (2) and (6), $R^3$ and $R^4$ represent identical or different monovalent groups selected from among alkyl, aryl, aralkyl and hydrogen, among which alkyl aryl and hydrogen are preferred. In this case, the number of carbon atoms of the alkyl group is preferably 1-24 and more preferably 1-12. The number of carbon atoms of the aryl group is preferably 6-20 and more preferably 6-10. The number of carbon atoms of the aralkyl group is preferably 7-24 and more preferably 7-12. More specifically, for groups $R^3$ and $R^4$ there may be mentioned alkyl groups such as methyl, ethyl, isopropyl, t-butyl and octyl, aryl groups such as phenyl, naphthyl and biphenyl, aralkyl groups such as benzyl and phenethyl, and hydrogen, among which methyl, phenyl and hydrogen are especially preferred.

Also in formulas (2) and (6), $R^5$ represents a substituted or unsubstituted aromatic divalent group, an oxypoly(dimethylsiloxy) group or oxygen. In this case, the number of carbon atoms of the aromatic divalent group is preferably 6-24 and more preferably 6-12. Aromatic divalent groups include divalent aromatic hydrocarbon groups (arylene, etc.) and arylene groups containing hetero atoms such as oxygen as connecting groups. As substituents to be bonded to the aromatic divalent group there may be mentioned alkyl aryl and aralkyl. More specifically, for group $R^5$ there may be mentioned arylene groups such as phenylene, naphthylene and biphenylene, substituted arylene groups such as diphenylether, and oxygen, among which phenylene, diphenylether and oxygen are especially preferred.

Also in formulas (2) and (6), $R^6$ represents alkyl aryl or hydrogen. In this case, the number of carbon atoms of the alkyl group is preferably 1-24 and more preferably 1-12. The number of carbon atoms of the aryl group is preferably 6-20 and more preferably 6-10. The number of carbon atoms of the aralkyl group is preferably 7-24 and more preferably 7-12. More specifically, for group $R^6$ there may be mentioned alkyl groups such as methyl, ethyl, isopropyl t-butyl and octyl, aryl groups such as phenyl, naphthyl and biphenyl, and aralkyl groups such as benzyl and phenethyl.

Also in formulas (2) and (6), a and b represent the numbers of each of the repeating units, where a is a positive integer of preferably 1-20,000, more preferably 3-10,000 and more preferably 5-10,000. Also, b is 0 or a positive integer of preferably 0-1000 and more preferably 0-100. However, a and b are in a component proportion, and are not limited to any particular form of bonding state (block copolymerization, random copolymerization, etc.).

There is no particular restriction on the numerical ratio of a and b (a:b) in the copolymer, and a larger a/b ratio, i.e. a greater proportion of the chain-like structure in the polymer main chain, is predicted to increase the solubility of the copolymer in the solvent and lower the melting point, thereby improving workability of the copolymer. On the other hand, a lower a/b ratio, i.e. a greater proportion of the crosslinked structure in the polymer main chain, is predicted to improve the heat resistance and combustion resistance of the copolymer. Thus, the optimum range for the a/b ratio of the copolymer may be appropriately selected so as to produce satisfactory workability, heat resistance and combustion resistance, depending on the purpose of use, or depending on the structures and combinations of the monomer units of the copolymer.

Also in formulas (2) and (6), p represents 0 or a positive integer and q represents 0 or a positive integer, and these are in the following relationship with n: p+q+2=n. The preferred range for p is 0-10, with 1-8 being more preferred. The preferred range for q is also 0-10, with 1-8 being more preferred. Also in formulas (2) and (6), $Z^1$ is a divalent group represented by the following formula (7):

(7)

or the following formula (8):

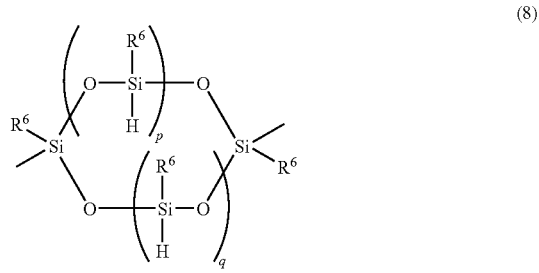

(8)

where $Z^1$ may consist of the structure of either (7) or (8) in the same molecular chain, or it may include both structures in the same molecular chain. The symbols $R^3$, $R^4$, $R^5$, $R^6$, p and q in formulas (7) and (8) are the same as described above. The molecular weight of the borazine-based resin (Mn; number average molecular weight calculated using a calibration curve for standard polystyrene, with measurement by gel permeation chromatography (GPC)) is preferably 500 to 5 million and more preferably 1000 to 1 million. If the molecular weight (Mn) is excessively low, such as below 500, the heat resistance and the mechanical properties of the insulating film described hereunder will tend to be inferior, and, for example, prebaking will be more difficult to achieve when the insulating film is used as an interlayer insulating film, while peeling will tend to occur when the film is flattened by CMP. In contrast, if the molecular weight (Mn) is excessively high, such as above 5 million, the workability of the insulating film may be impaired, making it difficult to control the shape of metal plug-forming viaholes formed of W, etc. in the insulating film.

(Process for Production of Borazine Compounds for Insulating Film a and Composite Insulating Film)

A borazine-based resin represented by formula (2) can be produced by polymerizing a B,B',B"-trialkynylborazine and a hydrosilane in the presence of a solid catalyst. The metal-containing catalyst is preferably removed after the polymerization. Alternatively, it may be produced by hydroborating polymerization of a B,B',B"-trihydroborazine and a bis(alkynylsilane) in the presence of a catalyst.

As specific examples of B,B',B"-trialkynylborazines there may be mentioned B,B',B"-triethynylborazine, B,B',B"-triethynyl-N,N',N"-trimethylborazine, B,B',B"-tri(1-propynyl)borazine, B,B',B"-triphenylethynylborazine, B,B',B"-triphenylethynyl-N,N',N"-trimethylborazine, B,B',B"-triethynyl-N,N',N"-triphenylborazine, B,B',B"-triphenylethynyl-N,N',N"-triphenylborazine, B,B',B"-ethynyl-N,N',N"-tribenzylborazine and B,B',B"-tris(1-propynyl)-N,N',N"-trimethylborazine, which may be used alone or in combinations of two or more.

Hydrosilanes include bis(monohydrosilane)s, bis(dihydrosilane)s, bis(trihydrosilane)s and poly(hydrosilane)s. As specific examples there may be mentioned m-bis(cimethylsilyl)benzene, p-bis(dimethylsilyl)benzene, 1,4-bis(dimethylsilyl)naphthalene, 1,5-bis(dimethylsilyl)naphthalene, m-bis(methylethylsilyl)benzene, m-bis(methylphenylsilyl)benzene, p-bis(methyloctylsilyl)benzene, 4,4'-bis(methylbenzylsilyl)biphenyl, 4,4'-bis(methylphenethylsilyl)diphenylether, m-bis(methylsilyl)benzene, m-disilylbenzene, 1,1,3,3-tetramethyl-1,3-disiloxane, 1,3,5,7-tetramethylcyclotetrasiloxane, 1,3,5,7,9-pentamethylcyclopentasiloxane, 1,3,5,7-tetraethylcyclotetrasiloxane, 1,3,5-triphenylcyclotrisiloxane, 1,3,5,7-tetraphenylcyclotetrasiloxane and 1,3,5,7-tetrabenzylcyclotetrasiloxane, which may be used alone or in combinations of two or more.

There are no particular restrictions on the metal-containing catalyst to be used for production of the borazine-based resin, and there may be mentioned homogeneous metal-containing catalysts or heterogeneous metal-containing catalysts commonly used for hydrosilylation of acetylenes or olefins. Among these, heterogeneous metal-containing catalysts are particularly preferred when it is essential to further reduce the concentration of the metal component in the resin composition.

As homogeneous metal-containing catalysts there may be mentioned platinum-divinyltetramethyldisiloxane, platinum-cyclic divinylmethylsiloxane, platinic chloride, dichloroplatinum, tris(dibenzylideneacetone)diplatinum, bis(ethylene)tetrachlorodiplatinum, cyclooctadienedichloroplatinum, bis(cyclooctadiene)platinum, cyclooctadienedimethylplatinum, bis(triphenylphosphine)dichloroplatinum, tetrakis(triphenylphosphine)platinum and the like, or the compounds mentioned in Comprehensive Handbook on Hydrosilylation, Pergamon Press (1992), ed. by B. Marciniec.

As heterogeneous metal-containing catalysts there may be mentioned simple metal powders such as platinum powder, palladium powder or nickel powder, simple supported metals such as platinum-carbon, platinum-alumina, platinum-silica, palladium-carbon, palladium-alumina, palladium-silica, rhodium-carbon, rhodium-alumina or rhodium-silica, Raney nickel, or the polymer-supported rhodium catalysts (polym- $PPh_2.RhCl(PPh_3)_3$, polym-$PPh_2.RhCl_3$, polym-$CH_2Cl_2.RhCl(CO)(PPh_3)_2$ and the like) or polymer-supported platinum catalysts (polym-$CH_2SH/H_2PtCl_6$) described in Comprehensive Handbook on Hydrosilylation, Pergamon Press (1992) edited by B. Mareiniec or Polymer Journal, 34, 97-102 (2002) (where "polym" means a main chain skeleton such as poly(styrene-co-divinylbenzene)), and silica gel-supported platinum catalysts with surface functional groups (Silica-$(CH_2)_3$—$SH/H_2PtCl_6$). These catalysts may be used alone or in combinations of two or more.

The amount of catalyst used is preferably in the range of 0.000001-5 as the molar ratio of metal atoms with respect to the starting material compound present in the smaller molar amount among the B,B',B"-trialkynylborazine compound or hydrositane.

For production of a borazine-based resin represented by formula (2), there is used a polymerization solvent which maintains the fluidity of the system while facilitating removal of the metal-containing catalyst after polymerization. The polymerization solvent used may be any of various solvents which do not react with the starting materials. Specifically, there may be mentioned aromatic hydrocarbon-based, saturated hydrocarbon-based, aliphatic ether-based and aromatic ether-based solvents, and more specifically there may be mentioned toluene, benzene, xylene, ethylbenzene, propylbenzene, hexylbenzene, hexane, tetrahydrofuran, ethyleneglycol dimethyl ether and diphenyl ether. These polymerization solvents may be used alone or in combinations of two or more.

The amount of polymerization solvent used is preferably 50-100,000 parts by weight of the polymerization solvent with respect to 100 parts by weight as the total of the B,B',B"-trialkynylborazine or hydrosilane.

The charging molar ratio of the B,B',B"-trialkynylborazine and hydrosilane for production of the borazine-based resin is preferably in the range of 0.1-10 moles of the hydrosilane with respect to 1 mole of the B,B',B"-trialkynylborazine, and more preferably in the range of 0.2-5 moles of the hydrosilane with respect to 1 mole of the B,B',B"-trialkynylborazine.

The reaction temperature and reaction time for production of the borazine-based resin are not particularly restricted so long as the conditions are such for polymerization of a B,B',B"-trialkynylborazine and a hydrosilane to yield a borazine-based resin with the desired molecular weight. Specifically, cooling or heating may be carried out for a reaction temperature in the range of −20° C. to 200° C., although this will depend on the reactivity of the starting materials and the catalyst activity. The reaction temperature is more preferably in the range of 0-150° C. and even more preferably in the range of 0-100° C. The reaction time is preferably from 1 minute to 10 days, more preferably from 1 hour to 10 days and most preferably from 2 hours to 7 days.

The polymerization reaction is preferably carried out in an inert atmosphere such as dry nitrogen or argon, but from the standpoint of simplifying the apparatus construction it may also be carried out in air.

By filtering the reaction solution to remove the metal-containing catalyst after synthesis of the borazine-based resin, it is possible to obtain a filtrate containing the borazine-based resin. The filtration method employed may be ordinary natural filtration, suction filtration, pressure filtration or the like. The filtering material used may be filter paper, filtering cloth or a resin film, while removal of the catalyst by natural precipitation or centrifugation is also included as "filtration" according to the invention.

After completion of the polymerization reaction, particles which are insoluble in the polymerization system and capable of adsorbing the metal component of the metal catalyst (metal scavengers) may be added to the polymerization system (polymer solution), and the metal component-adsorbed metal scavengers remaining in the polymer solution subsequently filtered out. Such treatment is particularly effective for reducing the metal content when employing a homogeneous metal-containing catalyst.

The filtrate containing the borazine-based resin obtained in this manner may then be concentrated under reduced pressure or heated to concentration to remove the solvent, in order to obtain the borazine-based resin composition starting material as an insulating film material in the form of a solid polymer. The borazine-based resin composition starting material can also be obtained by separation using reprecipitation, a gel filtration column, GPC (gel permeation chromatography) or the like.

The borazine-based resin composition to be used as an insulating film material may be produced by the methods described above to obtain a reaction solution filtrate resulting from the process of producing the borazine-based resin, the same filtrate combined with a solvent having a higher boiling point than the polymerization solvent and having had the low boiling point polymerization solvent removed, or a solution of the solid borazine-based resin in a solvent.

As solvents or diluents capable of dissolving the borazine-based resin composition there may be mentioned those which can dissolve but not react with polymers having a borazine skeleton in the main chain or a side chain, i.e. borazine-based resins. Specifically, there may be mentioned hydrocarbon solvents such as toluene, benzene, xylene, mesitylene, ethylbenzene, propylbenzene, hexylbenzene, tetralin, pentane, hexane, heptane, cyclohexane and dimethylcyclohexane, ether solvents such as ethyleneglycol dimethyl ether, tetrahydrofuran, 1,4-dioxane and diphenylether, ketone solvents such as acetone, methyl ethyl ketone, methyl isobutyl ketone, diisobutyl ketone, cyclopentanone and cyclohexanone, ester solvents such as ethyl acetate, butyl acetate, pentyl acetate and γ-butyrolactone, nitrogen-containing solvents such as N,N-dimethylformamide, N,N-dimethylacetamide, N-methyl-2-pyrrolidone, N-cyclohexyl-2-pyrrolidone and quinoline, halogen-based solvents such as chloroform, and dimethylsulfoxide.

These solvents or diluting solvents may be used alone or in combinations of two or more. The amount of the solvent or diluting solvent used is preferably such as to produce a borazine-based resin solid concentration of 0.1-60 wt %.

The component including a borazine skeleton in its molecular structure, and therefore the insulating film of the invention which comprises it, preferably contains no metal components, and it is preferably formed of a borazine-based resin composition with a metal impurity content of no greater than 30 ppm and more preferably no greater than 10 ppm. A metal impurity concentration exceeding 30 ppm will tend to result in leak current due to metal components residing in the insulating film, or the specific dielectric constant of the insulating film may excessively increase, adversely affecting the device performance.

(First Borazine-Based Resin Production Process and Borazine-Based Resin Composition)

For the first borazine-based resin production process, the B,B',B"-trialkynylborazine used in the first step (component x1; hereinafter referred to a simply as "x1") is preferably a compound represented by the following formula (3).

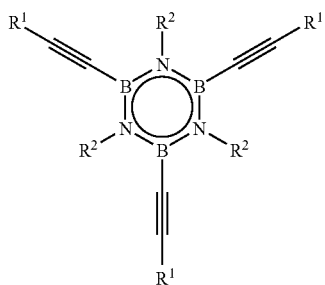
(3)

In formula (3) above, $R^1$ represents alkyl, aryl, aralkyl or hydrogen. The number of carbon atoms of the alkyl group is preferably 1-24 and more preferably 1-12. The number of carbon atoms of the aryl group is preferably 6-20 and more preferably 6-10. The number of carbon atoms of the aralkyl group is preferably 7-24 and more preferably 7-12. More specifically, for group $R^1$ there may be mentioned alkyl groups such as methyl, ethyl, isopropyl, t-butyl and octyl, aryl groups such as phenyl, naphthyl and biphenyl, aralkyl groups such as benzyl and phenethyl, and hydrogen, among which methyl, ethyl, phenyl and hydrogen are especially preferred.

Also in formula (3), $R^2$ represents alkyl aryl, aralkyl or hydrogen. The number of carbon atoms of the alkyl group is preferably 1-24 and more preferably 1-12. The number of carbon atoms of the aryl group is preferably 6-20 and more preferably 6-10. The number of carbon atoms of the aralkyl group is preferably 7-24 and more preferably 7-12. More specifically, for group $R^2$ there may be mentioned alkyl groups such as methyl, ethyl, isopropyl, t-butyl and octyl, aryl groups such as phenyl, naphthyl, biphenyl and anthracenyl, aralkyl groups such as benzyl, phenethyl and fluorenyl, and hydrogen, among which methyl, phenyl and hydrogen are especially preferred.

As more specific examples of B,B',B"-trialkynylborazines represented by formula (3) there may be mentioned B,B',B"-triethynylborazine, B,B',B"-triethynyl-N,N',N"-trimethylborazine, B,B',B"-tri(1-propynyl)borazine, B,B',B"-triphenylethynylborazine, B,B',B"-triphenylethynyl-N,N',N"-trimethylborazine, B,B',B"-triethynyl-N,N',N"-triphenylborazine, B,B',B"-triphenylethynyl-N,N',N"-triphenylborazine, B,B',B"-ethynyl-N,N',N"-tribenzylborazine and B,B',B"-tris(1-propynyl)-N,N',N"-trimethylborazine. However, there is no limitation to these. Also, one of these B,B',B"-trialkynylborazines may be used alone, or two different B,B',B"-trialkynylborazines may be used in combination.

The hydrosilane used in the first step (component y1; hereinafter referred to a simply as "y1") is preferably a compound represented by the following formula (4) or (5).

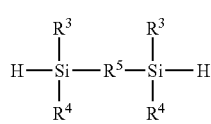
(4)

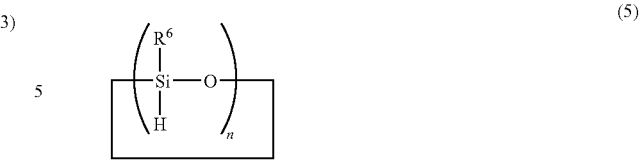
(5)

In formula (4), $R^3$ and $R^4$ represent identical or different monovalent groups selected from among alkyl, aryl, aralkyl and hydrogen, among which among which alkyl, aryl and hydrogen are preferred. In this case, the number of carbon atoms of the alkyl group is preferably 1-24 and more preferably 1-12. The number of carbon atoms of the aryl group is preferably 6-20 and more preferably 6-10. The number of carbon atoms of the aralkyl group is preferably 7-24 and more preferably 7-12. More specifically, for groups $R^3$ and $R^4$ there may be mentioned alkyl groups such as methyl, ethyl, isopropyl, t-butyl and octyl, aryl groups such as phenyl, naphthyl and biphenyl, aralkyl groups such as benzyl and phenethyl, and hydrogen, among which methyl, phenyl and hydrogen are especially preferred.

Also in formula (4), $R^5$ represents a substituted or unsubstituted aromatic divalent group, an oxypoly(dimethylsiloxy) group or oxygen. In this case, the number of carbon atoms of the aromatic divalent group is preferably 6-24 and more preferably 6-12. Aromatic divalent groups include divalent aromatic hydrocarbon groups (arylene, etc.) and arylene groups containing hetero atoms such as oxygen as connecting groups. As substituents to be bonded to the aromatic divalent group there may be mentioned alkyl, aryl and aralkyl. More specifically, for group $R^5$ there may be mentioned arylene groups such as phenylene, naphthylene and biphenylene, substituted arylene groups such as diphenylether, and oxygen, among which phenylene, diphenylether and oxygen are especially preferred.

In formula (5), $R^6$ represents alkyl aryl or hydrogen. In this case, the number of carbon atoms of the alkyl group is preferably 1-24 and more preferably 1-12. The number of carbon atoms of the aryl group is preferably 6-20 and more preferably 6-10. The number of carbon atoms of the aralkyl group is preferably 7-24 and more preferably 7-12. More specifically, for group $R^6$ there may be mentioned alkyl groups such as methyl, ethyl, isopropyl, t-butyl and octyl, aryl groups such as phenyl, naphthyl and biphenyl, and aralkyl groups such as benzyl and phenethyl.

Also in formula (5), n represents a positive integer of 2 or greater. The letters p and q in formula (2) above are in the following relationship with n: p+q+2=n. The preferred range for n is 2-10 and more preferably 3-8. If n is excessively large (i.e. the ring is large), such as greater than 10, the heat resistance and the mechanical properties of the insulating film described below will tend to be reduced to an inconvenient level.

The hydrosilanes (y1) represented by formula (4) or (5) include bis(monohydrosilane)s, bis(dihydrosilane)s, bis(trihydrosilane)s and poly(hydrosilane)s. Specifically, there may be mentioned m-bis(dimethylsilyl)benzene, p-bis(dimethylsilyl)benzene, 1,4-bis(dimethylsilyl)naphthalene, 1,5-bis(dimethylsilyl)naphthalene, m-bis(methylethylsilyl)benzene, m-bis(methylphenylsilyl)benzene, p-bis(methyloctylsilyl)benzene, 4,4'-bis(methylbenzylsilyl)biphenyl, 4,4'-bis(methylphenethylsilyl)diphenylether, m-bis(methylsilyl)benzene, m-disilylbenzene, 1,1,3,3-tetramethyl-1,3-disiloxane, 1,3,5,7-tetramethylcyclotetrasiloxane, 1,3,5,7,9-pentamethylcyclopentasiloxane, 1,3,5,7-tetraethylcyclotetrasiloxane, 1,3,5-triphenylcyclotrisiloxane, 1,3,5,7-tetraphenylcyclotetrasiloxane and 1,3,5,7-tetrabenzylcyclotetrasiloxane. However, there is no limitation to these.

Preferred among these are m-bis(dimethylsilyl)benzene, p-bis(dimethylsilyl)benzene, 1,1,3,3-tetramethyl-1,3-disiloxane and 1,3,5,7-tetramethylcyclotetrasiloxane. Although one hydrosilane (y1) may be used alone, two or more different hydrosilanes (y1) may also be used in combination.

The solid catalyst (z1) used for the first step is preferably a metal-containing catalyst which promotes polymerization reaction of the B,B',B"-trialkynylborazine (x1) and the hydrositane (y1), whose metal components do not elute in the reaction substrates (x1 and y1) or the optionally added polymerization solvent described hereunder, and which can be removed by filtration after completion of the polymerization.

As specific examples for the solid catalyst (z1) there may be mentioned simple metal powders such as platinum powder, palladium powder or nickel powder; catalysts comprising a catalyst supported on a carbon-based carrier, such as platinum-carbon, palladium-carbon or rhodium-carbon; and catalysts comprising a catalyst supported on a compound-based carrier (non-carbon-based carrier). As catalysts comprising a catalyst supported on a compound-based carrier there may be mentioned metal oxide-supported catalysts such as platinum-alumina, platinum-silica, palladium-alumina, palladium-silica, rhodium-alumina and rhodium-silica; synthetic catalysts such as Raney nickel; the polymer-supported rhodium catalysts (polym-$PPh_2.RhCl(PPh_3)_3$, polym-$PPh_2.RhCl_3$, polym-$CH_2Cl_2RhCl(CO)(PPh_3)_2$ and the like) or polymer-supported platinum catalysts (polym-$CH_2SH/H_2PtCl_6$) described in Comprehensive Handbook on Hydrosilylation, Pergamon Press (1992) edited by B. Marciniec or Polymer Journal, 34, 97-102 (2002) (where "polym" means a main chain skeleton such as poly(styrene-co-divinylbenzene)); and silica gel-supported platinum catalysts with surface functional groups (Silica-$(CH_2)_3$—$SH/H_2PtCl_6$). These catalysts may be used alone or in combinations of two or more.

The solid catalyst (z1) is preferably a supported catalyst comprising a catalyst supported on a simple metal powder or compound-based carrier, and most preferably it is a supported catalyst comprising a catalyst supported on a compound-based carrier. Since the particle sizes of such catalysts can be easily controlled, it is possible to create large-sized particles relatively easily, and using a catalyst of such a size will facilitate filtration of the catalyst from the reaction system. This is also particularly effective for inhibiting leak current when the borazine-based resin is used as an insulating film. On the other hand, since a catalyst which comprises a catalyst supported on a carbon-based carrier is present in the form of fine powder, the precipitation rate in the reaction system is slow and it is not always easy to remove the catalyst to a satisfactory degree. Moreover, since the catalyst contains conductive carbon, leak current may be generated in the insulating film when residual trace amounts of the catalyst are present.

When polymerization reaction between the B,B',B"-trialkynylborazine (x1) and the hydrosilane (y1) is carried out in the first step, a polymerization solvent (component s1; hereinafter referred to simply as "s1") may be added to maintain the fluidity of the system during polymerization and facilitate removal of the solid catalyst (z1) after polymerization. The polymerization solvent (s1) used may be any solvent which does not react with the starting materials (x1, y1), dissolve the solid catalyst (z1) or elute the metal components. As such solvents there may be mentioned aromatic hydrocarbon-based, saturated hydrocarbon-based, aliphatic ether-based and aromatic ether-based solvents, and more specifically there may be mentioned toluene, benzene, xylene, ethylbenzene, propylbenzene, hexylbenzene, hexane, tetrahydrofuran, ethyleneglycol dimethyl ether and diphenyl ether. These polymerization solvents may be used alone or in combinations of two or more.

The charging molar ratio of the B,B',B"-trialkynylborazine (x) and hydrosilane (y) in the first step is preferably in the range of 0.1-10 moles of the bis(hydrosilane) with respect to 1 mole of the B,B',B"-trialkynylborazine, and more preferably in the range of 0.2-5 moles of the bis(hydrosilane) with respect to 1 mole of the B,B',B"-trialkynylborazine.

The amount of the solid catalyst (z) used is preferably in the range of 0.000001-5 as the molar ratio of metal atoms with respect to the starting material compound present in the smaller molar amount among the B,B',B"-trialkynylborazine compound or hydrosilane.

The amount of polymerization solvent (s1) used in the first step is preferably 50-100,000 parts by weight of the polymerization solvent (s1) with respect to 100 parts by weight as the total of the B,B',B"-trialkynylborazine or hydrosilane.

The reaction temperature and reaction time for the first step are not particularly restricted so long as the conditions are such for polymerization of the B,B',B"-trialkynylborazine and hydrosilane to yield a borazine-based resin with the desired molecular weight. Specifically, cooling or heating may be carried out for a reaction temperature in the range of −20° C. to 200° C., although this will depend on the reactivity of the starting materials and the catalyst activity. The reaction temperature is more preferably in the range of 0-150° C. and even more preferably in the range of 0-100° C. The reaction time is preferably from 1 minute to 10 days, more preferably from 1 hour to 10 days and most preferably from 2 hours to 7 days.

The first step is preferably carried out in an inert atmosphere such as dry nitrogen or argon, but from the standpoint of simplifying the apparatus construction it may also be carried out in air.

After completion of the first step, the solid catalyst (z1) is then removed in the second step. The removal is preferably accomplished by filtration of the reaction solution obtained in the first step. The filtration method employed may be ordinary natural filtration, suction filtration, pressure filtration or the like. The filtering material used may be filter paper, filtering cloth or a resin film, while removal of the catalyst by natural precipitation or centrifugation is also included in the concept of "filtration". Removal of the solid catalyst (z1) in this manner will yield a filtrate containing the borazine-based resin (organic silicon/borazine-based polymer) having a reduced metal impurity content.

After completion of the second step, the obtained filtrate may then be concentrated under reduced pressure or heated to concentration to remove the polymerization solvent (z1), in order to obtain the borazine-based resin in the form of a solid polymer. The borazine-based resin starting material can also be obtained by separation using reprecipitation, a gel filtration column, GPC (gel permeation chromatography) or the like. The filtrate obtained in the second step may be directly used as the borazine-based resin composition (hereinafter, "C1").

The borazine-based resin composition (C1) may be produced by uniformly mixing the borazine-based resin obtained by the borazine-based resin production process described above with a solvent as described hereunder. Specifically, the filtrate obtained from the second step may be used directly as the borazine-based resin composition (C1), or a solvent having a higher boiling point than the polymerization solvent may be added to the filtrate obtained from the second step and then the low boiling point polymerization solvent removed. In the latter case, the borazine-based resin composition (C1) will be a mixture of the high boiling point solvent and the borazine-based resin. The borazine-based resin composition (C1) may also be produced by dissolving a solid borazine polymer produced in the manner described above in the solvent described hereunder, after the second step.

As solvents capable of dissolving the borazine-based resin there may be mentioned those which can dissolve but not react with the borazine-based resin. As such solvents there may be mentioned hydrocarbon solvents such as toluene, benzene, xylene, mesitylene, ethylbenzene, propylbenzene, hexylbenzene, tetralin, pentane, hexane, heptane, cyclohexane and dimethylcyclohexane, ether solvents such as ethyleneglycol dimethyl ether, tetrahydrofuran, 1,4-dioxane and diphenylether, ketone solvents such as acetone, methyl ethyl ketone, methyl isobutyl ketone, diisobutyl ketone, cyclopentanone and cyclohexanone, ester solvents such as ethyl acetate, butyl acetate, pentyl acetate and γ-butyrolactone, nitrogen-containing solvents such as N,N-dimethylformamide, N,N-dimethylacetamide, N-methyl-2-pyrrolidone, N-cyclohexyl-2-pyrrolidone and quinoline, halogen-based solvents such as chloroform, and dimethylsulfoxide.

These solvents or diluting solvents may be used alone or in combinations of two or more. The amount of the solvent used is preferably such as to produce a borazine-based resin solid concentration of 0.5-80 wt %, preferably 1-70 wt % and more preferably 2-60 wt %. If the solid concentration is less than 0.5 wt %, the thickness of the film obtained by a single coating onto the substrate will be small, and the reliability of the film, including its strength and heat resistance, as well as its insulating property when dried as an insulating film, will be reduced. On the other hand, if the solid concentration is greater than 80 wt %, the viscosity of the borazine-based resin composition (C1) will be excessively increased, tending to hamper efforts to form a uniform thin film.

The borazine-based resin composition (C1) with such a construction has an adequately minimized content of metal components from the solid catalyst (z1) and of impurities such as halogens. The metal impurity content of the borazine-based resin composition (C1) is preferably no greater than 30 ppm, more preferably no greater than 10 ppm and even more preferably no greater than 5 ppm, from the viewpoint of not adversely affecting the production apparatus for the insulating film, and not creating leak current when the insulating film is used as an interlayer insulating film, or not impairing the characteristics of the insulating film, such as the dielectric constant.

Incidentally, another possible method for reducing the impurity concentration is a method of diluting the borazine-based resin composition (C1) with a solvent having a very low impurity concentration. However, while this method can reduce damage to the production apparatus for the insulating film, simultaneous reduction in the solid concentration of the borazine-based resin composition (C1) may also result, such that no substantial reduction is achieved in the proportion of the impurity concentration with respect to the solid concentration.

The insulating film A may also be formed from a borazine-based resin composition comprising a borazine-based resin obtained by the first borazine-based resin production process. (Second Borazine-Based Resin Production Process and Borazine-Based Resin Composition)

In the second borazine-based resin production process, the borazine-based resin having a repeating unit represented by formula (2) above is produced by polymerizing the B,B',B"-trialkynylborazine (component x2, hereinafter referred to simply as "x2") and the hydrosilane (component y2; hereinafter referred to simply as "y2") in a polymerization solvent (component s2; hereinafter referred to simply as "s2") in the presence of a metal catalyst (component z2; hereinafter referred to simply as "z2") (first step), subsequently adding particles which are insoluble in the polymerization system and are capable of adsorbing the metal component of the metal catalyst (metal scavengers) (component w; hereinafter referred to simply as "w") (second step), and then filtering out the metal scavengers onto which the metal component has been adsorbed (third step).

The B,B',B"-trialkynylborazine (x2) and hydrosilane (y2) used in the second borazine-based resin production process are the same as x1 and y2 described above. Also, the definitions and preferred examples for $R^1$ and $R^2$ in the B,B',B"-trialkynylborazine and the specific examples of B,B',B"-trialkynylborazines are also the same, and the definitions and preferred examples for $R^3$ and $R^4$ in the hydrosilane and the specific examples of hydrosilanes are also the same. In the second borazine-based resin production process as well, one or two or more different B,B',B"-trialkynylborazines may be used, and one or two or more different hydrosilanes may be used.

The solid catalyst (z2) used for the second borazine-based resin production process may be one ordinarily used for hydrosilylation of acetylenes or olefins. As specific examples for the solid catalyst (z2) there may be mentioned platinum-divinyltetramethyldisiloxane, platinum-cyclic divinylmethylsiloxane, platinic chloride, dichloroplatinum, tris(dibenzylideneacetone)diplatinum, bis(ethylene)tetrachlorodiplatinum, cyclooctadienedichloroplatinum, bis(cyclooctadiene)platinum, cyclooctadienedimethylplatinum, bis(triphenylphosphine)dichloroplatinum, tetrakis(triphenylphosphine)platinum and the like, or the compounds mentioned in Comprehensive Handbook on Hydrosilylation, Pergamon Press (1992), ed. by B. Marciniec. As additional specific examples for the metal catalyst (z2) there may be mentioned simple metal powders such as platinum powder, palladium powder or nickel powder, simple supported metals such as platinum-carbon, platinum-alumina, platinum-silica, palladium-carbon, palladium-alumina, palladium-silica, rhodium-carbon, rhodium-alumina or rhodium-silica, Raney nickel, or the polymer-supported rhodium catalysts (polym-$PPh_2.RhCl(PPh_3)_3$, polym-$PPh_2.RhCl_3$, polym-$CH_2Cl_2.RhCl(CO)(PPh_3)_2$ and the like) or polymer-supported platinum catalysts (Polym-$CH_2SH/H_2PtCl_6$) described in Comprehensive Handbook on Hydrosilylation, Pergamon Press (1992) edited by B. Marciniec or Polymer Journal, 34, 97-102 (2002) (where "polym" means a main chain skeleton such as poly(styrene-co-divinylbenzene)), and silica gel-supported platinum catalysts with surface functional groups (Silica-$(CH_2)_3$—$SH/H_2PtCl_6$).

These metal catalysts (z2) may be used alone or in combinations of two or more.

For production of a borazine-based resin represented by formula (2), there is used a polymerization solvent (s2) which maintains the fluidity of the system while facilitating removal of the metal scavenger (w) having the metal catalyst (z2)-derived metal component adhering thereto after the polymerization. The polymerization solvent (s2) used may be any of various solvents which do not react with the starting materials. Specifically, there may be used the same ones as for the polymerization solvent (s1) described above, with the same preferred examples. One type of polymerization solvent (s2) may be used alone, or two or more types may be used in combination.

The charging molar ratio of the B,B',B"-trialkynylborazine (x2) and hydrosilane (y2) for production of the borazine-based resin represented by formula (2) is preferably in the range of 0.1-10 moles of the hydrosilane with respect to 1 mole of the B,B',B"-trialkynylborazine, and more preferably in the range of 0.2-5 moles of the hydrosilane with respect to 1 mole of the B,B',B"-trialkynylborazine.

The amount of the metal catalyst (z2) used for production of the borazine-based resin represented by formula (2) is preferably in the range of 0.000001-5 as the molar ratio of metal atoms with respect to the starting material compound present in the smaller molar amount among the B,B',B"-trialkynylborazine compound or hydrositane.

The amount of the polymerization solvent (s2) used for production of the borazine-based resin represented by formula (2) is preferably 50-100,000 parts by weight of the polymerization solvent (s2) with respect to 100 parts by weight as the total of the B,B',B"-trialkynylborazine or hydrosilane.

The reaction temperature and reaction time for production of the borazine-based resin represented by formula (2) are not particularly restricted so long as the conditions are such for polymerization of a B,B',B"-trialkynylborazine and a hydrosilane to yield a borazine-based resin with the desired molecular weight. Specifically, cooling or heating may be carried out for a reaction temperature in the range of −20° C. to 200° C., although this will depend on the reactivity of the starting materials and the catalyst activity. The reaction temperature is more preferably in the range of 0-150° C. and even more preferably in the range of 0-100° C. The reaction time is preferably from 1 minute to 10 days, more preferably from 1 hour to 10 days and most preferably from 2 hours to 7 days.

The polymerization reaction is preferably carried out in an inert atmosphere such as dry nitrogen or argon, but from the standpoint of simplifying the apparatus construction it may also be carried out in air.

After synthesis of the borazine-based resin, particles which are insoluble in the polymerization system and capable of adsorbing the metal component of the metal catalyst (metal scavengers (w)) may be added to the polymerization system (polymer solution), and the metal component-adsorbed metal scavengers remaining in the polymer solution subsequently filtered out, for removal of the metal component of the metal catalyst (z2).

The metal scavengers (w) are particles which are capable of adsorbing (coordinating with) the metal component in the polymerization system and separating it out of the polymerization system. Specifically, there may be mentioned the following types of surface-modified particles which are used in "combinatorial chemistry".

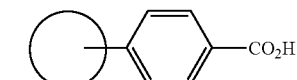
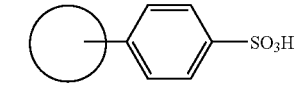
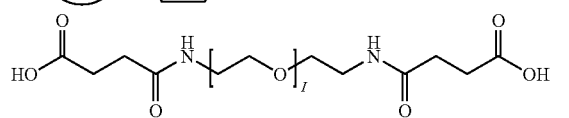
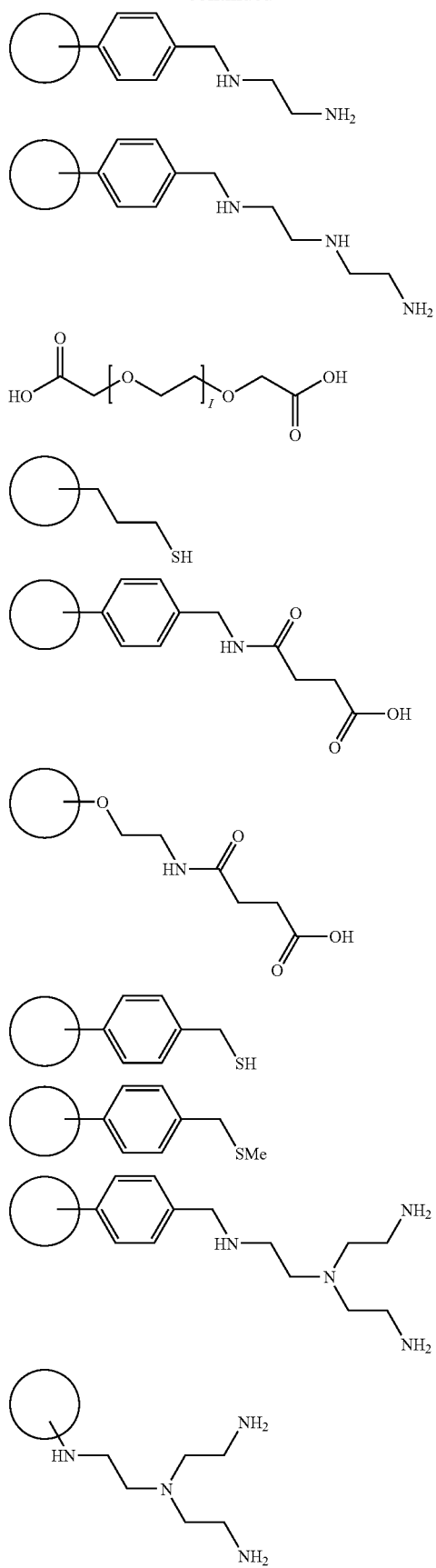

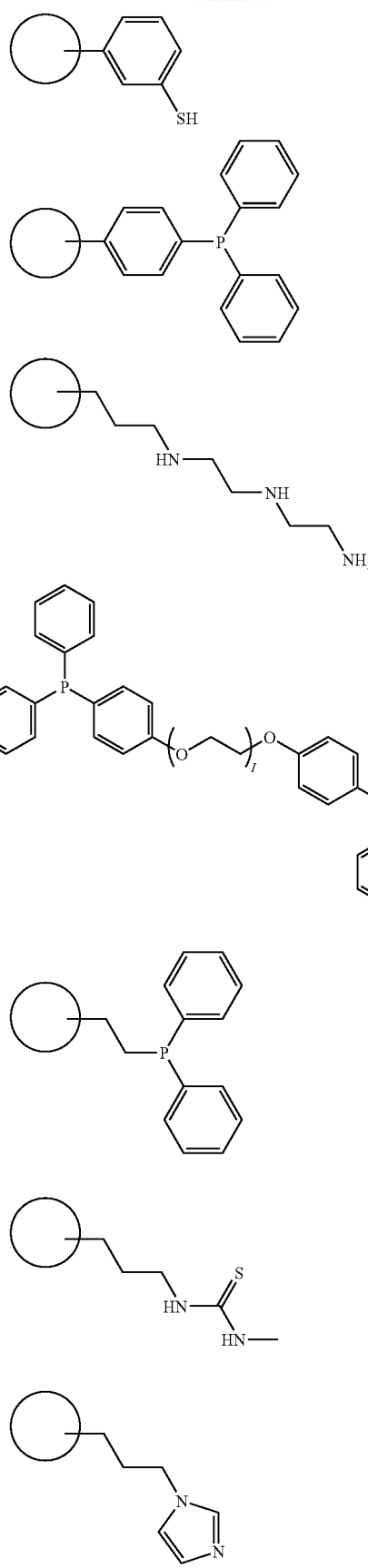

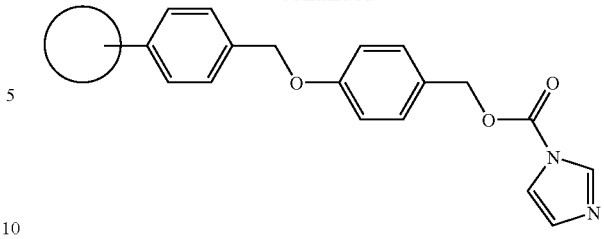

Here, O represents styrene-divinylbenzene copolymer, polyethyleneglycol-polystyrene graft copolymer or silica gel.

I represents an integer of 1 or greater.

Examples of other metal scavengers (w) include anionic exchange resins, silica gel particles, alumina particles, celite, active carbon powder and the like.

Although the amount of the metal scavengers (w) used will differ depending on the amount of the metal catalyst (z2) used for the polymerization and/or the ability of the metal scavengers (w) to adsorb (coordinate with) the metal in most cases the metal scavengers (w) are preferably used at 0.01-100 parts by weight with respect to 100 parts by weight as the total of the reaction solution (x2+y2+z2+s2).

Also, by adding the metal scavengers (w) to the polymerization system and stirring the solution, the metal scavengers will efficiently adsorb (coordinate with) the metal (second step). The time (contact time) for adsorption of the metal of the metal catalyst (z2) to the metal scavengers (w) will also differ depending on the amount of the metal catalyst (z2) used and/or the ability of the metal scavengers (w) to adsorb (coordinate with) the metal, but in most cases it will be from about 10 minutes to 24 hours.

Next, the reaction solution is filtered to remove the metal scavengers (w) onto which the metal component has adsorbed, in order to obtain a filtrate containing the borazine-based resin with a reduced metal impurity content (third step). The filtration method employed may be ordinary natural filtration, suction filtration, pressure filtration or the like. The filtering material used may be filter paper, filtering cloth or a resin film, while removal of the metal component-adsorbed metal scavengers (w) by natural precipitation or centrifugation is also included as "filtration" according to the invention.

The filtrate containing the borazine-based resin obtained in this manner is the borazine-based resin composition (component C2; hereinafter referred to simply as "C2").

The filtrate may be subjected to concentration under reduced pressure or heating to concentration for removal of the solvent, to obtain the borazine-based resin composition (C2) starting material in the form of a solid polymer. The borazine-based resin composition (C2) starting material can also be obtained by separation using reprecipitation, a gel filtration column, GPC (gel permeation chromatography) or the like.

The solvent of the borazine-based resin composition (C2) (component B; hereinafter referred to simply as "B") is one which dissolves but does not react with the polymer having a borazine skeleton on the main chain or a side chain (borazine-based resin). Specifically, there may be mentioned hydrocarbon-based solvents such as toluene, benzene, xylene, mesitylene, ethylbenzene, propylbenzene, hexylbenzene, tetralin, pentane, hexane, heptane, cyclohexane and dimethylcyclohexane, ether-based solvents such as ethylene glycol dimethyl ether, tetrahydrofuran, 1,4-dioxane and diphenylether, ketone-based solvents such as acetone, methyl ethyl ketone, methyl isobutyl ketone, diisobutyl ketone, cyclopentanone and cyclohexanone, ester-based solvents such as ethyl acetate, butyl acetate, pentyl acetate and γ-butyrolactone, nitrogen-containing solvents such as N,N-dimethylformamide, N,N-dimethylacetamide, N-methyl-2-pyrrolidone, N-cyclohexyl-2-pyrrolidone and quinoline, halogen-based solvents such as chloroform, and dimethylsulfoxide.

Any of these solvents (B) may be used alone or in combinations of two or more. The amount of the solvent (B) used is preferably such as to produce a borazine-based resin solid concentration of 0.5-80 wt %, preferably 1-70 wt % and more preferably 2-60 wt %. If the solid concentration is less than 0.5 wt %, the thickness of the film obtained by a single coating onto the substrate will be small, and the reliability of the film, including its strength and heat resistance, as well as its insulating property when dried as an insulating film, will tend to be reduced. On the other hand, if the solid concentration is greater than 80 wt %, the viscosity of the borazine-based resin composition (C2) will be excessively increased, tending to hamper efforts to form a uniform thin film.

The borazine-based resin composition (C2) is a mixture (substantially homogeneous mixture) of a borazine-based resin and the solvent (B). The borazine-based resin composition (C2) may be produced by various methods, such as by adding a solvent having a higher boiling point than the polymerization solvent to the filtrate after filtration of the metal component-adsorbed metal scavengers (w) obtained from the process of producing the borazine-based resin and then removing the low boiling point polymerization solvent (and hence a mixture of the high boiling point solvent and the borazine-based resin), or by dissolving a solid borazine-based resin in the solvent.

The borazine-based resin composition (C2) with such a construction has an adequately minimized content of metal components from the solid catalyst (z2) and of impurities such as halogens. The impurity content of the borazine-based resin composition (C2) is preferably no greater than 30 ppm, more preferably no greater than 10 ppm and even more preferably no greater than 5 ppm, from the viewpoint of not adversely affecting the production apparatus for the insulating film, and not creating leak current when the insulating film is used as an interlayer insulating film and not impairing the characteristics of the insulating film, such as the dielectric constant.

Incidentally, another possible method for reducing the impurity concentration of the borazine-based resin composition (C2) is a method of diluting the borazine-based resin composition (C2) with a solvent having a very low impurity concentration. However, while this method can reduce damage to the production apparatus for the insulating film, simultaneous reduction in the solid concentration of the borazine-based resin composition (C2) may also result, such that no substantial reduction is achieved in the proportion of the impurity concentration with respect to the solid concentration.

The insulating film A may also be formed from a borazine-based resin composition comprising a borazine-based resin obtained by the second borazine-based resin production process.

(Insulating Film a and Electronic Part A)

An example of a method of forming an insulating film A using the aforementioned borazine-based resin composition will now be described. First, a film is formed by coating the borazine-based resin composition on a substrate such as a silicon wafer, metal sheet or ceramic board by a method such as dipping, spraying, screen printing or spin coating. The solvent is then removed by heat drying the coating in air or an inert gas such as nitrogen at 60-500° C. for a period of about 10 seconds to 2 hours. This can yield an insulating film composed of a non-sticky thin film. The thickness of the insulating film is not particularly restricted, but from the standpoint of heat resistance it is preferably 0.05-50 µm, more preferably 0.1-10 µm and most preferably 0.2-5 µm.

As examples of an electronic part A using an insulating film A formed in the manner described above there may be mentioned semiconductor elements, liquid crystal elements and multilayer wiring boards having insulating films. The insulating film of the invention is preferably used as a surface protective film, buffer coat film or insulating film such as an interlayer insulating film for a semiconductor element, as a surface protective film or insulating film for a liquid crystal element, or as an interlayer insulating film for a multilayer wiring board.

Specifically, as semiconductor elements there may be mentioned discrete semiconductor elements such as diodes, transistors, capacitors, compound semiconductor elements, thermistors, varistors and thyristors, memory elements such as DRAM (dynamic random access memory), SRAM (static random access memory), EPROM (erasable-programmable read only memory), mask ROM (mask read only memory), EEPROM (electrical erasable-programmable read only memory) and flash memory, logic (circuit) elements such as microprocessors, DSP and ASIC, integrated circuit elements such as compound semiconductors typified by MMIC (monolithic microwave integrated circuits), and photoelectric conversion elements, light emitting elements and semiconductor laser elements including hybrid integrated circuits, light emitting diodes and charge-coupled device. As multilayer wiring boards there may be mentioned high-density wiring boards such as MCM.

(Composite Insulating Film and Electronic Part B)

The first insulating film comprising a siloxane resin in a composite insulating film of the invention is not particularly restricted so long as it contains a polymer with a siloxane skeleton, and preferably it is a cured siloxane resin composition comprising a siloxane resin obtained by hydrolytic condensation of a compound represented by the following formula (1).

$$X^1{}_n SiX^2{}_{4-n} \qquad (1)$$

In this formula, $X^1$ represents an H atom, an F atom, a group containing a B atom, N atom, Al atom, P atom, Si atom, Ge atom or Ti atom, or an organic group of 1 to 20 carbons, $X^2$ represents a hydrolyzable group, and n represents an integer of 0-2, with the proviso that when n is 2, each $X^2$ may be the same or different, and when n is 0-2, each $X^2$ may be the same or different.

As hydrolyzable groups for $X^2$ there may be mentioned alkoxy, halogens, acetoxy, isocyanate, hydroxyl and the like. Alkoxy groups are preferred among these from the standpoint of the liquid stability and film coating property of the composition used to form the first insulating film.

As examples of compounds wherein the hydrolyzable group $X^2$ is an alkoxy group (alkoxysilanes) there may be mentioned tetraalkoxysilanes such as tetramethoxysilane, tetraethoxysilane, tetra-n-propoxysilane, tetra-iso-propoxysilane, tetra-n-butoxysilane, tetra-sec-butoxysilane, tetra-tert-butoxysilane and tetraphenoxysilane, trialkoxysilanes such as trimethoxysilane, triethoxysilane, tripropoxysilane, fluorotrimethoxysilane, fluorotriethoxysilane, methyltrimethoxysilane, methyltriethoxysilane, methyltri-n-propoxysilane, methyltri-iso-propoxysilane, methyltri-n-butoxysilane, methyltri-iso-butoxysilane, methyltri-tert-butoxysilane, methyltriphenoxysilane, ethyltrimethoxysilane, ethyltriethoxysilane, ethyltri-n-propoxysilane, ethyltri-iso-propoxysilane, ethyltri-n-butoxysilane, ethyltri-iso-butoxysilane, ethyltri-tert-butoxysilane, ethyltriphenoxysilane, n-propyltrimethoxysilane, n-propyltriethoxysilane, n-propyltri-n-propoxysilane, n-propyltri-iso-propoxysilane, n-propyltri-n-butoxysilane, n-propyltri-iso-butoxysilane, n-propyltri-tert-butoxysilane, n-propyltriphenoxysilane, iso-propyltrimethoxysilane, iso-propyltriethoxysilane, iso-propyltri-n-propoxysilane, iso-propyltri-iso-propoxysilane, iso-propyltri-n-butoxysilane, iso-propyltri-iso-butoxysilane, iso-propyltri-tert-butoxysilane, iso-propyltriphenoxysilane, n-butyltrimethoxysilane, n-butyltriethoxysilane, n-butyltri-n-propoxysilane, n-butyltri-iso-propoxysilane, n-butyltri-n-butoxysilane, n-butyltri-iso-butoxysilane, n-butyltri-tert-butoxysilane, n-butyltriphenoxysilane, sec-butyltrimethoxysilane, sec-butyltiethoxysilane, sec-butyltri-n-propoxysilane, sec-butyltri-iso-propoxysilane, sec-butyltri-n-butoxysilane, sec-butyltri-iso-butoxysilane, sec-butyltri-tert-butoxysilane, sec-butyltriphenoxysilane, t-butyltrimethoxysilane, t-butyltriethoxysilane, t-butyltri-n-propoxysilane, t-butyltri-iso-propoxysilane, t-butyltri-n-butoxysilane, t-butyltri-iso-butoxysilane, t-butyltri-tert-butoxysilane, t-butyltriphenoxysilane, phenyltrimethoxysilane, phenyltriethoxysilane, phenyltri-n-propoxysilane, phenyltri-iso-propoxysilane, phenyltri-n-butoxysilane, phenyltri-iso-butoxysilane, phenyltri-tert-butoxysilane, phenyltriphenoxysilane, trifluoromethyltrimethoxysilane, pentafluoroethyltrimethoxysilane, 3,3,3-trifluoropropyltrimethoxysilane and 3,3,3-trifluoropropyltriethoxysilane, diorganodialkoxysilanes such as dimethyldimethoxysilane, dimethyldiethoxysilane, dimethyldi-n-propoxysilane, dimethyldi-iso-propoxysilane, dimethyldi-n-butoxysilane, dimethyldi-sec-butoxysilane, dimethyldi-tert-butoxysilane, dimethyldiphenoxysilane, diethyldimethoxysilane, diethyldiethoxysilane, diethyldi-n-propoxysilane, diethyldi-iso-propoxysilane, diethyldi-n-butoxysilane, diethyldi-sec-butoxysilane, diethyldi-tert-butoxysilane, diethyldiphenoxysilane, di-n-propyldimethoxysilane, di-n-propyldiethoxysilane, di-n-propyldi-n-propoxysilane, di-n-propyldi-iso-propoxysilane, di-n-propyldi-n-butoxysilane, di-n-propyldi-sec-butoxysilane, di-n-propyldi-tert-butoxysilane, di-n-propyldiphenoxysilane, di-iso-propyldimethoxysilane, di-iso-propyldiethoxysilane, di-iso-propyldi-n-propoxysilane, di-iso-propyldi-iso-propoxysilane, di-iso-propyldi-n-butoxysilane, di-iso-propyldi-sec-butoxysilane, di-iso-propyldi-tert-butoxysilane, di-iso-propyldiphenoxysilane, di-n-butyldimethoxysilane, di-n-butyldiethoxysilane, di-n-butyldi-n-propoxysilane, di-n-butyldi-iso-propoxysilane, di-n-butyldi-n-butoxysilane, di-n-butyldi-sec-butoxysilane, di-n-butyldi-tert-butoxysilane, di-n-butyldiphenoxysilane, di-sec-butyldimethoxysilane, di-sec-butyldiethoxysilane, di-sec-butyldi-n-propoxysilane, di-sec-butyldi-iso-propoxysilane, di-sec-butyldi-n-butoxysilane, di-sec-butyldi-sec-butoxysilane, di-sec-butyldi-tert-butoxysilane, di-sec-butyldiphenoxysilane, di-tert-butyldimethoxysilane, di-tert-butyldiethoxysilane, di-tert-butyldi-n-propoxysilane, di-tert-butyldi-iso-propoxysilane, di-tert-butyldi-n-butoxysilane, di-tert-butyldi-sec-butoxysilane, di-tert-butyldi-tert-butoxysilane, di-tert-butyldiphenoxysilane, diphenyldimethoxysilane, diphenyldiethoxysilane, diphenyldi-n-propoxysilane, diphenyldi-iso-propoxysilane, diphenyldi-n-butoxysilane, diphenyldi-sec-butoxysilane, diphenyldi-tert-butoxysilane, diphenyldiphenoxysilane, bis(3,3,3-trifluoropropyl)dimethoxysilane and methyl(3,3,3-trifluoropropyl)dimethoxysilane.

In addition to the alkoxysilanes mentioned above, there may also be mentioned as compounds represented by formula (1) halogenosilanes wherein the alkoxy group of the aforementioned alkoxysilane molecule is replaced with a halogen, acetoxysilanes wherein the same alkoxy group is replaced with an acetoxy group, isocyanatesilanes wherein the same alkoxy group is replaced with an isocyanate group, and silanols wherein the same alkoxy group is replaced with a hydroxyl group. Any of these compounds represented by formula (1) may be used alone, or two or more different ones may be used in combination.

The catalyst used to promote the hydrolytic condensation reaction for hydrolytic condensation of the compound represented by formula (1) may be an acidic catalyst or a basic catalyst. As acidic catalysts there may be mentioned organic acids such as formic acid, maleic acid, fumaric acid, acetic acid, propionic acid, butanoic acid, pentanoic acid, hexanoic acid, heptanoic acid, octanoic acid, nonanoic acid, decanoic acid, oxalic acid, adipic acid, sebacic acid, butyric acid, oleic acid, stearic acid, linoleic acid, linolenic acid, salicylic acid, benzoic acid, p-aminobenzoic acid, p-toluenesulfonic acid, phthalic acid, sulfonic acid, tartaric acid and trifluoromethanesulfonic acid, as well as hydrochloric acid, phosphoric acid, nitric acid, boric acid, sulfuric acid and hydrofluoric acid. Examples of basic catalysts include ammonia, organic amines and the like.

The catalyst used to promote the hydrolytic condensation reaction is preferably used in a range of 0.0001-1 mole with respect to 1 mole of the compound represented by formula (1). If used in an amount of less than 0.0001 mole, the polymerization reaction will probably not proceed to a sufficient degree. It is preferably not used at greater than 1 mole because this may tend to promote gelling.

The alcohol by-product of the hydrolytic condensation reaction may be removed using an evaporator or the like as necessary. Also, the amount of water in the hydrolytic condensation reaction system may be set as appropriate, and is preferably in the range of 0.5-20 moles with respect to 1 mole of the compound represented by formula (1). If the amount of water is outside of the range of 0.5-20 moles, the film forming property may be impaired and the storage stability may be reduced.

From the standpoint of solubility in the solvent, mechanical properties and moldability, the siloxane resin obtained by hydrolytic condensation of the compound represented by formula (1) preferably has a weight average molecular weight of 500-20,000 and more preferably 1000-10,000 as the value measured by gel permeation chromatography (GPC) based on a standard polystyrene calibration curve.

The siloxane resin composition used to form the first insulating film will usually contain a solvent as an essential component. As examples of such solvents there may be mentioned alcohol-based solvents such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, n-octanol, 2-ethylhexanol, sec-octanol, n-nonyl alcohol, n-decanol, sec-undecyl alcohol, trimethylnonyl alcohol, sec-tetradecyl alcohol, sec-heptadecyl alcohol, phenol, cyclohexanol, methylcyclohexanol, benzyl alcohol, ethylene glycol, 1,2-propylene glycol, 1,3-butylene glycol, diethylene glycol, dipropylene glycol, triethylene glycol and tripropylene glycol, ketone-based solvents such as acetone, methyl ethyl ketone, methyl-n-propyl ketone, methyl-n-butyl ketone, methyl-iso-butyl ketone, methyl-n-pentyl ketone, methyl-n-hexyl ketone, diethyl ketone, di-iso-butyl ketone, trimethylnonanone, cyclohexanone, cyclopentanone, methylcyclohexanone, 2,4-pentanedione, acetonylacetone, diacetone alcohol, acetophenone and γ-butyrolactone, ether-based solvents such as ethyl ether, iso-propyl ether, n-butyl ether, n-hexyl ether, 2-ethylhexyl ether, ethylene oxide, 1,2-propylene oxide, dioxolane, 4-methyldioxolane, dioxane, dimethyldioxane, ethyleneglycol monomethyl ether, ethyleneglycol monoethyl ether, ethyleneglycol diethyl ether, ethyleneglycol mono-n-hexyl ether, ethyleneglycol monophenyl ether, ethyleneglycol mono-2-ethylbutyl ether, ethyleneglycol dibutyl ether, diethyleneglycol monoethyl ether, diethyleneglycol diethyl ether, diethyleneglycol diethyl ether, diethyleneglycol mono-n-butyl ether, diethyleneglycol di-n-butyl ether, diethyleneglycol mono-n-hexyl ether, ethoxy triglycol, tetraethyleneglycol di-n-butyl ether, propyleneglycol monomethyl ether, propyleneglycol monoethyl ether, propyleneglycol monopropyl ether, dipropyleneglycol monomethyl ether, dipropyleneglycol monoethyl ether, tripropyleneglycol monomethyl ether, tetrahydrofuran and 2-methyltetrahydrofuran, ester-based solvents such as methyl acetate, ethyl acetate, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, nonyl acetate, γ-butyrolactone, γ-valerolactone, methyl acetoacetate, ethyl acetoacetate, ethyleneglycol monomethyl ether acetate, ethyleneglycol monoethyl ether acetate, diethyleneglycol monomethyl ether acetate, diethyleneglycol monoethyl ether acetate, diethyleneglycol mono-n-butyl ether acetate, propyleneglycol monomethyl ether acetate, propyleneglycol monoethyl ether acetate, propyleneglycol monopropyl ether acetate, dipropyleneglycol monomethyl ether acetate, dipropyleneglycol monoethyl ether acetate, glycol diacetate, methoxytriglycol acetate, ethyl propionate, n-butyl propionate, i-amyl propionate, diethyl oxalate, di-n-butyl oxalate, methyl lactate, ethyl lactate, n-butyl lactate and n-amyl lactate, as well as acetonitrile, N,N-dimethylformamide, N,N-dimethylacetamide and N,N-dimethylsulfoxide, among which any one alone or two or more different ones in combination may be used.

The amount of solvent used in the siloxane resin composition is preferably such as to produce a siloxane resin concentration of 3-25 wt %. If the amount of solvent used is too small such that the siloxane resin concentration exceeds 25 wt %, the liquid stability and film forming property will tend to be reduced to an inconvenient level. On the other hand, if the amount of solvent used is too large such that the siloxane resin concentration is less than 3 wt %, it will tend to be difficult to obtain a first insulating film having the desired film thickness.

A pore-forming material may optionally be added to the siloxane resin composition of the invention as necessary. As specific examples of pore-forming materials there may be mentioned polymers including (meth)acrylic acid derivatives such as acrylic acid, 2-hydroxyethyl acrylate, diethyleneglycol acrylate, 2-hydroxypropyl acrylate, dipropyleneglycol acrylate, methacrylic acid, 2-hydroxyethyl methacrylate, diethyleneglycol methacrylate, 2-hydroxypropyl methacrylate and dipropyleneglycol methacrylate, as well as vinyl alcohol, allyl alcohol vinyl ether-based compounds, vinyl-based compounds with polyethylene oxide structures, vinyl-based compounds with polypropylene oxide structures, vinylpyridine-based compounds, styrene-based compounds, alkyl ester/vinyl-based compounds, (meth)acrylate/acid-based compounds, propylene glycol-based compounds and ethylene glycol-based compounds.

The method for forming a composite insulating film according to the invention may be a method such as dipping, spraying, screen printing or spin coating, among which spin coating is preferred in most cases in consideration of the film forming property and uniformity of film thickness.

When a spin coating method is employed, the siloxane resin composition is preferably spin coated onto a substrate such as silicon wafer, metal sheet or ceramic board at 500-5000 rpm and more preferably 1000-3000 rpm. If the spin coating rotation rate is less than 500 rpm, the film thickness uniformity will tend to be inferior, and if it is greater than 5000 rpm, the film forming property will tend to be inferior.

The solvent is preferably removed by drying using a hot plate at 50-300° C. and more preferably 100-300° C. This will form a first insulating film on the substrate. If the drying temperature is below 50° C., the solvent drying will tend to be insufficient. If the drying temperature is above 300° C., and the siloxane resin composition includes a pore-forming material such as a thermal decomposing volatile compound, it will tend to thermally decompose and volatilize before the siloxane skeleton forms, thereby making it impossible to achieve the desired dielectric property.

The borazine-based resin composition is preferably coated onto the first insulating film-formed substrate by spin coating at 500-5000 rpm and more preferably 1000-3000 rpm, and the solvent is removed by drying using a hot plate or curing oven at 50-300° C. and more preferably 100-300° C. This will form a second insulating film on the first insulating film.

Final curing is carried out in air or an inert gas such as nitrogen, preferably at 60-500° C. and preferably for a period of about 10 seconds to 2 hours, to obtain a composite insulating film according to the invention. The apparatus used is preferably a quartz tube furnace, hot plate, rapid thermal annealing heater or lamp heating apparatus.

The film thickness of the bilayer structure composite insulating film obtained in this manner is preferably 0.01-40 μm and more preferably 0.1-2.0 μm. A film thickness of greater than 40 μm may lead to stress-related cracking, while a thickness of less than 0.1 μm will tend to result in inferior inter-wiring leak characteristics when a wiring layer is provided above and below the composite insulating film.

FIG. 1 is a schematic cross-sectional view showing an example of a composite insulating film according to the invention. The composite insulating film shown in this drawing comprises a siloxane resin-containing insulating film 102 formed on a silicon wafer 100 having a metal wiring layer 101 provided on a silicon substrate layer (first insulating film), which is coated with a borazine-based resin-containing insulating film 103 (second insulating film). The composite insulating film may be easily formed by the spin coating method described above.

As electronic parts B employing the composite insulating film of the invention there may be mentioned parts with insulating films, such as semiconductor elements, liquid crystal elements and multilayer wiring boards. In a semiconductor element, the composite insulating film of the invention is preferably used as a surface protective film, buffer coat film or insulating film such as an interlayer insulating film, in a liquid element it is preferably used as a surface protective film or insulating film, and in a multilayer wiring board it is preferably used as an interlayer insulating film. It may also be useful as a laminate (structure) wherein another upper film, such as a hard mask, anti-reflection (AR) film, reflection film, resist film or the like covers the second insulating film which contains a borazine skeleton in the molecular structure. Of particular utility is a laminated body formed with a hard mask, which is necessary for formation of a metal wiring pattern on the insulating film and which requires firm adhesion.

Specifically, as semiconductor elements there may be mentioned the same types of semiconductor elements mentioned for the electronic part A. As multilayer wiring boards there may be mentioned high-density wiring boards such as MCM.
(Insulating Film Employing Borazine-Based Resin, and Electronic Part C)

The aforementioned borazine-based resin composition (C1 or C2) may be used to form an insulating film of the invention by the following method. Specifically, first a film is formed by coating the borazine-based resin composition (C1 or C2) on a substrate such as a silicon wafer, metal sheet or ceramic board by a method such as dipping, spraying, screen printing or spin coating. The solvent is then removed by heat drying the coating in air or an inert gas such as nitrogen at 60-500° C. for a period of about 10 seconds to 2 hours. This can yield an insulating film composed of a non-sticky thin film. The thickness of the insulating film is not particularly restricted, but from the standpoint of heat resistance it is preferably 0.05-50 µm, more preferably 0.1-10 µm and most preferably 0.2-5 µm.

As examples of an electronic part C using an insulating film formed in the manner described above there may be mentioned semiconductor elements, liquid crystal elements and multilayer wiring boards having insulating films. The insulating film of the invention is preferably used as a surface protective film, buffer coat film or insulating film such as an interlayer insulating film for a semiconductor element, as a surface protective film or insulating film for a liquid crystal element, or as an interlayer insulating film for a multilayer wiring board.

Figure 2:
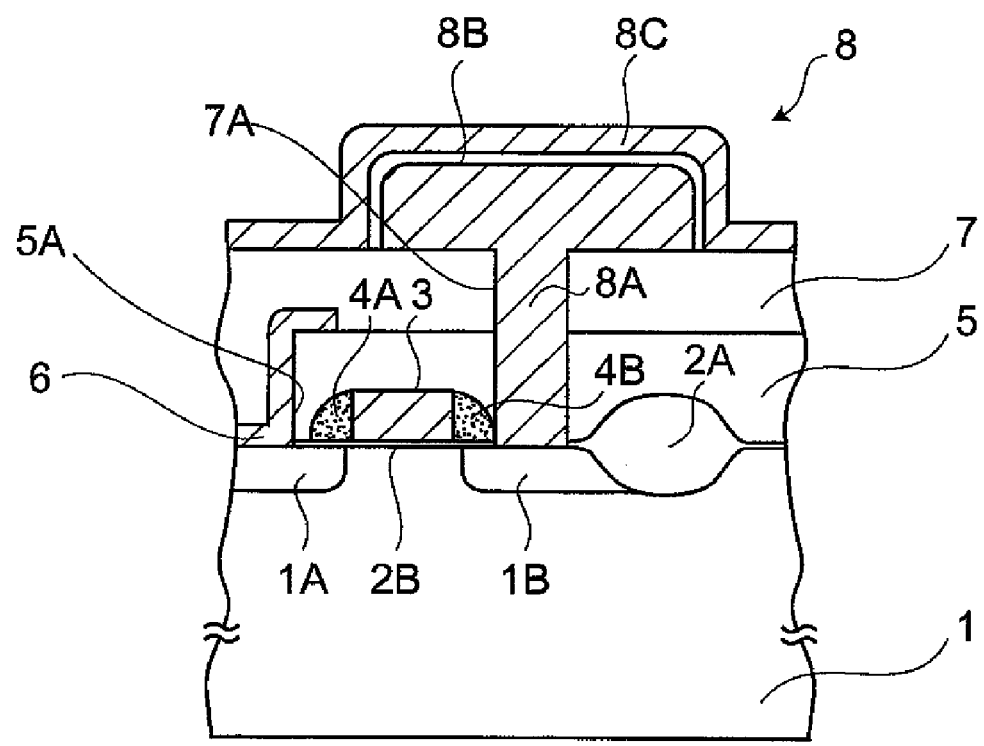
FIG. 2 is a schematic cross-sectional view showing a preferred embodiment of an electronic part according to the invention.

Specifically, as semiconductor elements there may be mentioned the same semiconductor elements mentioned above for electronic part A. As multilayer wiring boards there may be mentioned high-density wiring boards such as MCM.
Preferred Embodiments of Electronic Parts A-C FIG. 2 is a schematic cross-sectional view showing a preferred embodiment of an electronic part A-C according to the invention. This memory capacitor cell 8 (electronic part) comprises an interlayer insulating film (composite insulating film) having a bilayer structure composed of an insulating layer 5 (first insulating film) and an insulating layer 7 (second insulating film) formed by a spin coating method, formed between a counter electrode 8C provided above and a gate electrode 3 (functioning as a word line) below which is situated on a silicon wafer 1 (substrate) provided with diffusion regions 1A,1B, via a gate insulating film 2B composed of an oxidation film.

Side wall oxidation films 4A,4B are formed on the side walls of the gate electrode 3, while a field oxidation film 2A is formed on the diffusion region 1B beside the gate electrode, for separation of the element. A contact hole 5A is formed in the insulating layer 5 for embedding of an electrode 6 which functions as a bit line near the gate electrode 3. A flattened insulating layer 7 covers the flattened insulating layer 5, and a storage electrode 8A is embedded in the contact hole 7A formed through both layers. Also, a counter electrode 8C is provided on the storage electrode 8A via a capacitor insulating film 8B composed of a high dielectric body.

The insulating layer 5 and insulating layer 7 may have either the same composition or different compositions. The insulating layer 5 and/or insulating layer 7 may be insulating films A, and the borazine-based resin composition comprising a borazine-based resin obtained by the first or second borazine-based resin production process may be used to form the insulating films by the forming method described above. Alternatively, the insulating layer 5 may be the first insulating film and the insulating layer 7 may be the second insulating film, as a composite insulating film.

An electronic part such as a memory capacitor cell 8 having the insulating film A formed thereon exhibits an adequately reduced specific dielectric constant of the insulating film compared to the prior art, so that the wiring delay time for signal propagation can be satisfactorily shortened and leak current can be effectively prevented. As a result, higher performance of the element can be realized and higher reliability can be achieved. Such characteristics can also be obtained when the insulating film is formed using a borazine-based resin composition comprising a borazine-based resin obtained by the first or second borazine-based resin production process.

On the other hand, in an electronic part such as a memory capacitor cell 8 having first and second insulating films formed thereon, the interlayer insulating films consist of an insulating layer 5 comprising a siloxane resin and an insulating layer 7 comprising a borazine-based resin, and therefore satisfactorily reduced specific dielectric constant can be achieved. It is thereby possible to sufficiently shorten the wiring delay time for signal propagation. In addition, since the film strength of the composite insulating film is adequately increased and satisfactorily strong bonding is formed between the insulating layers 5,7 and between the insulating layer 7 and the counter electrode 8C, interlayer peeling is prevented during the polishing steps such as CMP in the production processes for electronic products such as memory capacitor cells 8, thereby helping to prevent reduced product yields and improve device reliability.

EXAMPLES

The present invention will now be explained in greater detail by examples, with the understanding that the invention is not limited to these examples.

Production Example 1-1

(Production of Borazine-Based Resin Composition 1-1)

After dissolving 0.50 mmol of B,B',B"-triethynyl-N,N',N"-trimethylborazine and 0.50 mmol of p-bis(dimethylsilyl)benzene in 4 ml of ethylbenzene, 5% platinum-alumina (0.1 mmol as platinum) was added and the mixture was stirred for 7 days under nitrogen at 50° C. A portion of the reaction solution was sampled and analyzed by gas chromatography (GC), confirming disappearance of the peaks for the B,B',B"-triethynyl-N,N',N"-trimethylborazine and p-bis(dimethylsilyl)benzene monomers. The molecular weight of the product as determined by GPC analysis (based on standard polystyrene) was Mn=2500 (Mw/Mn=2.0). The reaction solution containing the platinum-alumina catalyst was filtered with a disposable membrane filter unit by ADVANTEC to obtain a borazine-based resin composition 1-1.

Production Example 1-2

(Production of Borazine-Based Resin Composition 1-2)

After dissolving 0.50 mmol of B,B',B"-triethynyl-N,N',N"-trimethylborazine and 0.50 mmol of 1,3,5,7-tetramethyl-cyclotetrasiloxane in 4 ml of ethylbenzene, 5% platinum-alumina (0.1 mmol as platinum) was added and the mixture was stirred for 7 days under nitrogen at 50° C. A portion of the reaction solution was sampled and analyzed by gas chromatography (GC), confirming disappearance of the peak for the B,B',B"-triethynyl-N,N',N"-trimethylborazine monomer. The molecular weight of the product as determined by GPC analysis (based on standard polystyrene) was Mn=3000 (Mw/Mn=2.2). The reaction solution containing the platinum-alumina catalyst was filtered with a disposable membrane filter unit by ADVANTEC to obtain a borazine-based resin composition 1-2.

Production Example 1-3

(Production of Borazine-Based Resin Composition 1-3)

After dissolving 0.50 mmol of B,B',B"-trimethynyl-N,N',N"-trimethylborazine and 0.50 mmol of p-bis(dimethylsilyl)benzene in 4 ml of ethylbenzene, the polymer-supported platinum catalyst described in Polymer Journal, 34, 97-102 (2002) (Polym-CH$_2$SH/H$_2$PtC$_{16}$) (0.01 mmol as platinum) was added and the mixture was stirred for 5 days under nitrogen at 50° C. A portion of the reaction solution was sampled and analyzed by gas chromatography (GC), confirming disappearance of the peaks for the B,B',B"-triethynyl-N,N',N"-trimethylborazine and p-bis(dimethylsilyl)benzene monomers. The molecular weight of the product as determined by GPC analysis (based on standard polystyrene) was Mn=3800 (Mw/Mn=2.5). The reaction solution containing the polymer-supported platinum catalyst was filtered with a disposable membrane filter unit by ADVANTEC to obtain a borazine-based resin composition 1-3.

Production Example 1-4

(Production of Borazine-Based Resin Composition 1-4)

After dissolving 3.6 g (15 mmol) of B,B',B"-tris(1'-propynyl)-N,N',N"-trimethylborazine and 3.6 g (15 mmol) of 1,3,5,7-tetramethylcyclotetrasiloxane in 150 ml of mesitylene, 30 μl of a solution of platinum-divinyltetramethyldisiloxane in xylene (2% platinum content) was added and the mixture was stirred for 1 day under nitrogen at 40° C. After adding an additional 30 μl of a solution of platinum-divinyltetramethyldisiloxane in xylene (2% platinum content), the mixture was further stirred for 1 day under nitrogen at 40° C. Next, 0.36 g (1.5 mmol) of 1,3,5,7-tetramethylcyclotetrasiloxane was added and stirring was continued for 1 day under nitrogen at 40° C. A portion of the reaction solution was sampled and analyzed by gas chromatography (GC), confirming disappearance of the peaks for the B,B',B"-tris(1'-propynyl)-N,N',N"-trimethylborazine and 1,3,5,7-tetramethylcyclotetrasiloxane monomers. The molecular weight of the product as determined by GPC analysis (based on standard polystyrene) was Mn=11,000 (Mw/Mn=29).

After then adding 1.0 g of metal scavengers of formula (9) (3-mercaptopropyl-functionalized silica gel, product of Aldrich) to the reaction solution, it was stirred at room temperature for 2 hours. The platinum-adsorbed metal scavengers were filtered out on a PTFE membrane filter by ADVANTEC to obtain a borazine-based resin composition 1-4 according to the invention.

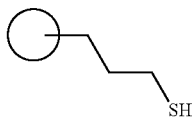

(9)

Production Example 1-5

(Production of Platinum-Containing Borazine-Based Resin Composition 1-5)

After dissolving 0.50 mmol of B,B',B"-triethynyl-N,N',N"-trimethylborazine and 0.50 mmol of p-bis(dimethylsilyl)benzene in 8 ml of ethylbenzene, 15 μl of a solution of the homogeneous metal catalyst platinum-divinyltetramethyldisiloxane in xylene (2% platinum content) was added and the mixture was stirred for 3 days under nitrogen at room temperature. A portion of the reaction solution was sampled and analyzed by gas chromatography (GC), confirming disappearance of the peaks for the B,B',B"-triethynyl-N,N',N"-trimethylborazine and p-bis(dimethylsilyl)benzene monomers. The molecular weight of the product as determined by GPC analysis (based on standard polystyrene) was Mn=4300 (Mw/Mn=2.5). The reaction solution was used as the borazine-based resin composition 5.

Example 1-1

(Production of Insulating Film 1-1)

The borazine-based resin composition 1-1 obtained in Production Example 1-1 was filtered through a filter and the filtrate was added dropwise onto a low resistivity silicon wafer (substrate; resistivity<10 Ωcm) for spin coating. The silicon wafer was then heated for 1 hour on a hot plate at 200° C. in a nitrogen atmosphere, and then baked at 300° C. for 30 minutes and at 400° C. for 30 minutes, to obtain an insulating film 1-1 of the invention.

Example 1-2>

(Production of Insulating Film 1-2)

An insulating film 1-2 of the invention was obtained in the same manner as Example 1-1, except that the borazine-based resin composition 1-2 obtained in Production Example 1-2 was used instead of the borazine-based resin composition 1-1.

Example 1-3

(Production of Insulating Film 1-3)

An insulating film 1-3 of the invention was obtained in the same manner as Example 1-1, except that the borazine-based resin composition 1-3 obtained in Production Example 1-3 was used instead of the borazine-based resin composition 1-1.

Example 1-4

(Production of Insulating Film 1-4)

An insulating film 1-4 of the invention was obtained in the same manner as Example 1-1, except that the borazine-based resin composition 1-4 obtained in Production Example 1-4 was used instead of the borazine-based resin composition 1-1.

Comparative Example 1-1

(Production of Insulating Film 1-5)

An insulating film 1-5 of the invention was obtained in the same manner as Example 1-1, except that the borazine-based resin composition 1-5 obtained in Production Example 1-5 was used instead of the borazine-based resin composition 1-1.

<Measurement of Metal Content>

The metal content of the borazine-based resin composition was measured by atomic absorption spectrometry using an AA-6650G by Shimadzu Laboratories. The platinum concentrations of the borazine-based resin compositions 1-1 to 1-5 are shown in Table 1.

TABLE 1

| Borazine-based resin composition | Platinum concentration (ppm) |
|---|---|
| 1-1 (Production Example 1-1) | 2 |
| 1-2 (Production Example 1-2) | 2 |
| 1-3 (Production Example 1-3) | 6 |
| 1-4 (Production Example 1-4) | 2 |
| 1-5 (Production Example 1-5) | 50 |

<Measurement of Specific Dielectric Constant>

The specific dielectric constant was measured for each insulating film obtained in the examples and comparative example. The "specific dielectric constant" of an insulating film according to the invention is the value measured in an atmosphere of 23° C.±2° C., 40±10% humidity, and it is determined by measuring the charge capacity between Al metal and an N-type low resistivity wafer (Si wafer).

Specifically, after forming the insulating film of each of the examples and comparative example, a vacuum vapor deposition apparatus was used for vacuum vapor deposition of Al metal with a diameter of 2 mm onto the insulating film to a thickness of about 0.1 μm. This formed a structure wherein the insulating film was situated between Al metal and a low resistivity wafer. The charge capacity of this structure was then measured at a use frequency of 1 MHz, using an apparatus comprising an LF impedance analyzer (HP4192A by Yokogawa Denki) connected to a dielectric test fixture (HP16451B by Yokogawa Denki).

The measured value of the charge capacity was substituted into the following formula:

Specific dielectric constant of insulating film=$3.597 \times 10^{-2} \times$ charge capacity (pF)×insulating film thickness (μm), to calculate the specific dielectric constant of the insulating film. The thickness of the insulating film was the value measured with an L116B ellipsometer by Gartner Japan.

<Measurement of Leak Current>

After measuring the specific dielectric constant of each wafer, the leak current was measured using a leak current measuring device.

<Measurement of Young's Modulus>

The Young's modulus of each insulating film was measured using a DCM nanoindenter by MTS Co., as an index of the film strength.

The results of measuring the specific dielectric constants, leak currents and Young's moduli of the insulating films 1-1 to 1-5 are shown in Table 2.

TABLE 2

| Insulating film | Specific dielectric constant (—) | Leak current (A/cm$^2$) | Young's modulus (GPa) |
|---|---|---|---|
| 1-1 (Example 1-1) | 2.1 | $1 \times 10^{-9}$ | 8 |
| 1-2 (Example 1-2) | 2.1 | $1 \times 10^{-9}$ | 9 |
| 1-3 (Example 1-3) | 2.2 | $2 \times 10^{-9}$ | 9 |
| 1-4 (Example 1-4) | 2.3 | $1 \times 10^{-9}$ | 7 |
| 1-5 (Comp. Ex. 1-1) | 2.7 | $1 \times 10^{-7}$ | 9 |

Example 2-1>

(Production of Siloxane Resin Composition 2-1)

To a solution of 132.3 g of tetraethoxysilane and 65.1 g of methyltriethoxysilane in 335.94 g of propyleneglycol monopropyl ether (PGP) there was added a solution of 0.92 g of 70% nitric acid in 65.8 g of water, dropwise over a period of 30 minutes while stirring. After completion of the dropwise addition, reaction was conducted for 5 hours to obtain a polysiloxane solution. Next, 22.9 g of a methyl methacrylate polymer solution was added and the produced ethanol was distilled off under reduced pressure in a warm bath to obtain 630 g of a siloxane resin composition 2-1.

(Production of Borazine-Based Resin Composition 2-1)

After dissolving 0.50 mmol of B,B',B"-triethynyl-N,N',N"-trimethylborazine and 0.50 mmol of p-bis(dimethylsilyl)benzene in 4 ml of ethylbenzene, 5% platinum-alumina (0.1 mmol as platinum) was added and the mixture was stirred for 7 days under nitrogen at room temperature. A portion of the reaction solution was sampled and analyzed by gas chromatography (GC), confirming disappearance of the peaks for the B,B',B"-triethynyl-N,N',N"-trimethylborazine and p-bis(dimethylsilyl)benzene monomers. The molecular weight of the product as determined by GPC analysis (based on standard polystyrene) was Mn=2500 (Mw/Mn=2.0). The reaction solution containing the platinum-alumina catalyst was filtered with a disposable membrane filter unit by ADVANTEC to obtain a borazine-based resin composition 2-1.

(Formation of Composite Insulating Film 2-1)

First, a siloxane resin composition was passed through a filter and spin coated onto a low resistivity silicon wafer (resistivity<10 Ωcm) at 2000 rpm/30 sec. The solvent was then removed at 150° C./1 min+250° C./1 min to form a first insulating film. This was followed by spin coating of a borazine-based resin composition at 1000 rpm/30 sec. The solvent was then removed at 200° C./10 min to form a second insulating film. The wafer was then subjected to 400° C./30 min in a quartz tube furnace with the O$_2$ concentration controlled to about 100 ppm for final curing of both insulating films, to obtain a composite insulating film 2-1 of the invention.

Example 2-2

(Production of Siloxane Resin Composition 2-2)

To a solution of 132.3 g of tetraethoxysilane and 65.1 g of methyltriethoxysilane in 335.94 g of propyleneglycol monopropyl ether (PGP) there was added a solution of 0.92 g of 70% nitric acid in 65.8 g of water, dropwise over a period of 30 minutes while stirring. After completion of the dropwise addition, reaction was conducted for 5 hours to obtain a polysiloxane solution. Next, 22.9 g of a methyl methacrylate polymer solution was added and the produced ethanol was distilled off under reduced pressure in a warm bath to obtain 630 g of a siloxane resin composition 2-2.

(Production of Borazine-Based Resin Composition 2-2)

After dissolving 3.6 g (15 mmol) of B,B',B"-tris(1'-propynyl)-N,N',N"-trimethylborazine and 3.6 g (15 mmol) of 1,3,5,7-tetramethylcyclotetrasiloxane in 150 ml of mesitylene, 30 μl of a solution of platinum-divinyltetramethyldisitoxane in xylene (2% platinum content) was added and the mixture was stirred for 1 day under nitrogen at 40° C. After adding an additional 30 μl of a solution of platinum-divinyltetramethyldisilsiloxane in xylene (2% platinum content), the mixture was further stirred for 1 day under nitrogen at 40° C. Next, 0.36 g (1.5 mmol) of 1,3,5,7-tetramethylcyclotetrasiloxane was added and stirring was continued for 1 day under nitrogen at 40° C. A portion of the reaction solution was sampled and analyzed by gas chromatography (GC), confirming disappearance of the peaks for the B,B',B"-tris(1'-propynyl)-N,N',N"-trimethylborazine and 1,3,5,7-tetramethylcyclotetrasiloxane monomers. The molecular weight of the product as determined by GPC analysis (based on standard polystyrene) was Mn=11,000 (Mw/Mn=29).

After then adding 1.0 g of metal scavengers of formula (9) (3-mercaptopropyl-functionalized silica gel, product of Aldrich) to the reaction solution, it was stirred at room temperature for 2 hours. The platinum-adsorbed metal scavengers were filtered out on a PTFE membrane filter by ADVANTEC to obtain a borazine-based resin composition 2-2 according to the invention.

(Formation of Composite Insulating Film 2-2)

First, the siloxane resin composition 2-2 was passed through a filter and spin coated onto a low resistivity silicon wafer (resistivity<10 Ωcm) at 2000 rpm/30 sec. The solvent was then removed at 150° C./1 min+250° C./1 min to form a first insulating film. This was followed by spin coating of the borazine-based resin composition 2-2 at 1000 rpm/30 sec. The solvent was then removed at 200° C./10 min to form a second insulating film. The wafer was subjected to 400° C./30 min in a quartz tube furnace with the $O_2$ concentration controlled to about 100 ppm for final curing of both insulating films, to obtain a composite insulating film 2-2 of the invention.

Comparative Example 2-1

The siloxane resin composition produced in Example 2-1 was passed through a filter and spin coated at 2000 rpm/30 sec. After the spin coating, the solvent was removed at 150° C./1 min+250° C./1 min to form a film. The wafer was then subjected to 400° C./30 min in a quartz tube furnace with the $O_2$ concentration controlled to about 100 ppm for final curing of the film, to obtain a comparison insulating film 2-3 composed of a single layer <Measurement of Specific Dielectric Constant>

The specific dielectric constants of composite insulating films 2-1 and 2-2 obtained in Examples 2-1 and 2-2 and the insulating film 2-3 obtained in Comparative Example 2-1 were measured. The definition and method of determining the "specific dielectric constant" were the same as for measurement of the film thickness of the insulating film.

<Measurement of Young's Modulus>

The Young's modulus of each insulating film was measured in the same manner as above, as an index of the film strength.

<Evaluation of CMP Resistance>

After laminating a P-TEOS film to 0.1 μm on each insulating film by CVD, Ta metal was laminated to 0.03 μm and Cu metal was laminated to 0.2 μm by sputtering. Each insulating film was then subjected to CMP polishing under conditions normally expected to avoid polishing of the insulating film (conditions for polishing of only the Cu). The slurry used was HS-C430 by Hitachi Kasei Kogyo Co., Ltd., and the polishing was carried out for 1 minute with an applied load of 400 gf/cm². Since the CMP conditions were such that only the Cu was polished, residue of the Ta metal on the film surface after polishing indicated no interfacial peeling between the films. Samples with a Ta metal surface remaining on the entire surface were evaluated as "O", and samples in which interfacial peeling between the films was observed or cohesive failure occurred due to inadequate film strength were evaluated as "x".

Table 3 shows the evaluation results for the specific dielectric constant, Young's modulus and CMP resistance for each of the composite insulating films 2-1 and 2-2 and the insulating film 2-3.

TABLE 3

|  | Specific dielectric constant (-) | Young's modulus (GPa) | CMP resistance |
|---|---|---|---|
| Composite insulating film 2-1 (Example 2-1) | 2.4 | 9 | o |
| Composite insulating film 2-2 (Example 2-2) | 2.3 | 8 | o |
| Insulating film 2-3 (Comp. Ex. 2-1) | 2.4 | 7 | x |

Example 3-1

(Production of Borazine-Based Resin Composition 3-1)

After dissolving 0.1 g (0.50 mmol) of B,B',B"-triethynyl-N,N',N"-trimethylborazine and 0.1 g (0.50 mmol) of p-bis(dimethylsilyl)benzene in 4 ml of ethylbenzene, 0.4 g of 5% platinum-alumina (0.1 mmol as platinum) was added as a supported catalyst having the catalyst supported on a compound-based carrier, and the mixture was stirred for 7 days under nitrogen at 50° C. A portion of the reaction solution was sampled and analyzed by gas chromatography (GC), confirming almost complete disappearance of the peaks for the B,B',B"-triethynyl-N,N',N"-trimethylborazine and p-bis(dimethylsilyl)benzene monomers.

Figure 3:
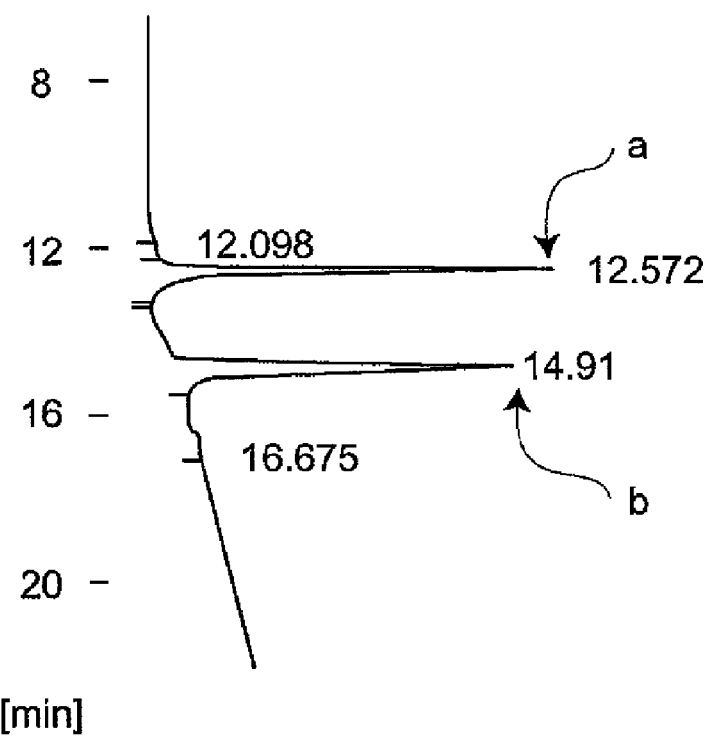
FIG. 3 is a graph showing a gas chromatogram of the reaction solution immediately after the start of polymerization in Example 3-1.
Figure 4:
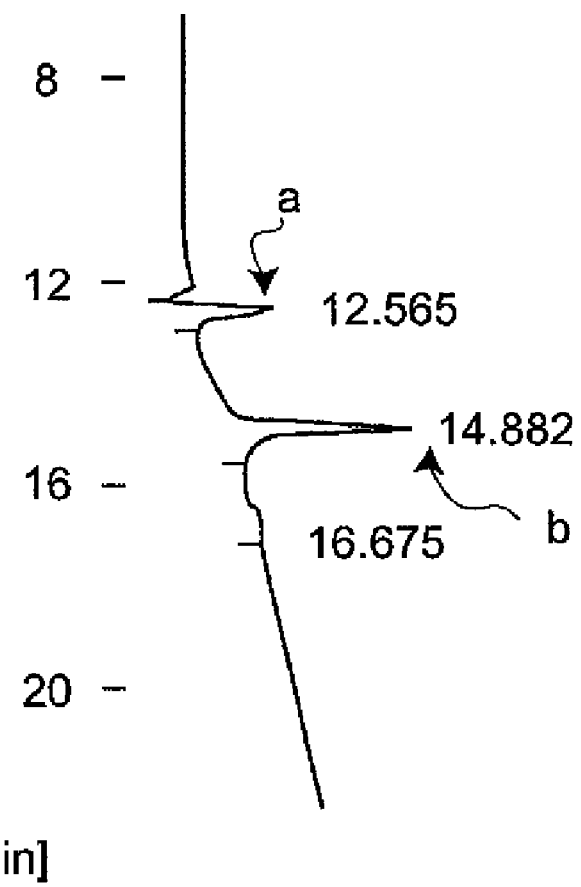
FIG. 4 is a graph showing a gas chromatogram of the reaction solution after 3 days of stirring from the start of polymerization in Example 3-1.

FIG. 3 is a graph showing a gas chromatogram of the reaction solution immediately after start of polymerization, and FIG. 4 is a graph showing a gas chromatogram of the reaction solution after 3 days of stirring from the start of polymerization. The letter "a" in FIG. 3 indicates the peak corresponding to p-bis(dimethylsilyl)benzene, and the letters "b" in FIGS. 3 and 4 indicate the peak corresponding to B,B',B"-triethynyl-N,N',N"-trimethylborazine.

Figure 5:
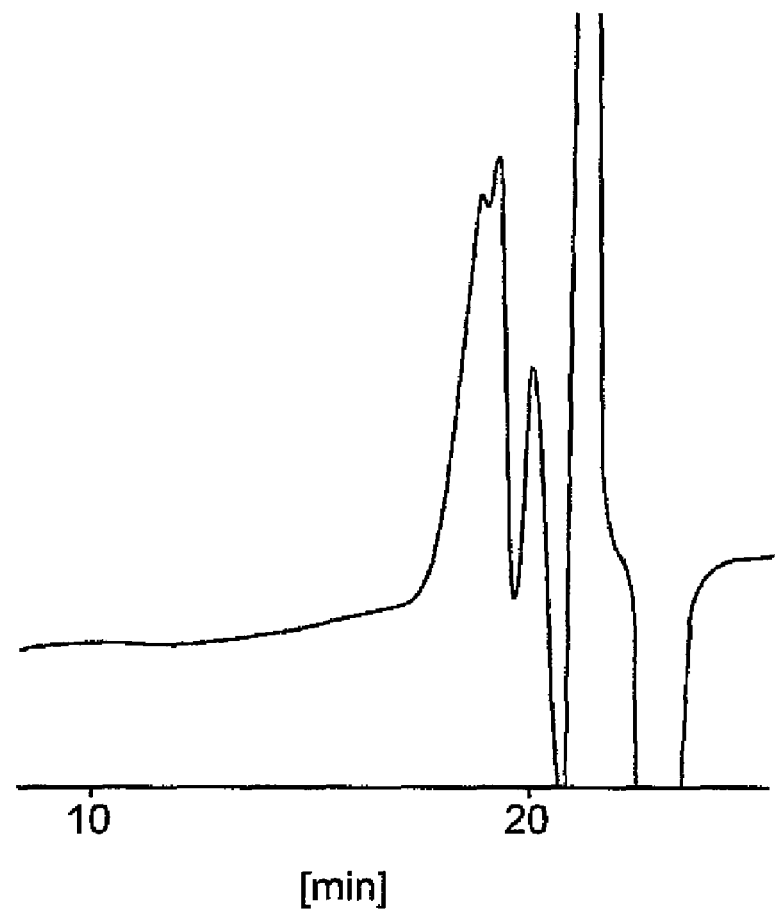
FIG. 5 is a graph showing a GPC chart for the polymer obtained in Example 3-1.

The molecular weight of the product as determined by GPC analysis (based on standard polystyrene) was Mn=2500 (Mw/Mn=2.0). FIG. 5 is a graph showing a GPC chart for the polymer. The reaction solution containing the platinum-alumina catalyst was filtered with a disposable membrane filter unit by ADVANTEC (filter mean pore size: 0.5 μm) to obtain a borazine-based resin composition 3-1.

Example 3-2

(Production of Borazine-Based Resin Composition 3-2)

After dissolving 0.1 g (0.50 mmol) of B,B',B"-triethynyl-N,N',N"-trimethylborazine and 0.12 g (0.50 mmol) of 1,3,5,7-tetramethylcyclotetrasiloxane in 4 ml of ethylbenzene, 0.4 g of 5% platinum-alumina (0.1 mmol as platinum) was added as a supported catalyst having the catalyst supported on a compound-based carrier, and the mixture was stirred for 7 days under nitrogen at 50° C. A portion of the reaction solution was sampled and analyzed by gas chromatography (GC), confirming almost complete disappearance of the peaks for the B,B',B"-triethynyl-N,N',N"-trimethylborazine monomer. The molecular weight of the product as determined by GPC analysis (based on standard polystyrene) was Mn=3000 (Mw/Mn=2.2). The reaction solution containing the platinum-alumina catalyst was filtered with a disposable membrane filter unit by ADVANTEC (filter mean pore size: 0.5 μm) to obtain a borazine-based resin composition 3-2.

Example 3-3

(Production of Borazine-Based Resin Composition 3-3)

A borazine-based resin composition 3-3 was obtained by the same method as in Example 3-1, except for using the polymer-supported platinum catalyst (polym-$CH_2SH$/$H_2PtCl_6$) described in Polymer Journal, 34, 97-102 (2002) (0.01 mmol as platinum) as a supported catalyst having the catalyst supported on a compound-based carrier.

Example 3-4

A borazine-based resin composition was obtained by the same method as Example 3-1, except for using a platinum-carbon catalyst (a catalyst supported on a carbon-based carrier) as a solid catalyst. Upon filtration with a disposable membrane filter unit by ADVANTEC (filter mean pore size: 0.5 μm), residue of the platinum-carbon catalyst was found in the filtrate, and therefore filtration was carried out again with the unit using a filter mean pore size of 0.2 μm, to obtain a borazine-based resin composition 3-4.

Comparative Example 3-1

(Production of Borazine-Based Resin Composition 3-5)

After dissolving 0.50 mmol of B,B',B"-triethynyl-N,N',N"-trimethylborazine and 0.50 mmol of p-bis(dimethylsilyl)benzene in 8 ml of ethylbenzene, 10 μl of a solution of the homogeneous metal catalyst platinum-divinyltetramethyldisiloxane in xylene (2% platinum content) was added and the mixture was stirred for 3 days under nitrogen at room temperature. A portion of the reaction solution was sampled and analyzed by gas chromatography (GC), confirming disappearance of the peaks for the B,B',B"-triethynyl-N,N',N"-trimethylborazine and p-bis(dimethylsilyl)benzene monomers. The molecular weight of the product as determined by GPC analysis (based on standard polystyrene) was Mn=4300 (Mw/Mn=2.5). The reaction solution was used as the borazine-based resin composition 3-5.

Example 3-5>

(Production of Insulating Film 3-1)

The borazine-based resin composition 3-1 obtained in Production Example 3-1 was filtered through a filter and the filtrate was added dropwise onto a low resistivity silicon wafer (substrate; resistivity<10 Ωcm) for spin coating. The silicon wafer was then heated for 1 hour on a hot plate at 200° C. in a nitrogen atmosphere, and then baked at 300° C. for 30 minutes and at 400° C. for 30 minutes, to obtain an insulating film 3-1 of the invention.

Example 3-6

(Production of Insulating Film 3-2)

An insulating film 3-2 of the invention was obtained in the same manner as Example 3-5, except that the borazine-based resin composition 3-2 obtained in Example 3-2 was used instead of the borazine-based resin composition 3-1.

Example 3-7

Production of Insulating Film 3-3

An insulating film 3-3 of the invention was obtained in the same manner as Example 3-5, except that the borazine-based resin composition 3-3 obtained in Example 3-3 was used instead of the borazine-based resin composition 3-1.

Example 3-8

(Production of Insulating Film 3-4)

An insulating film 3-4 of the invention was obtained in the same manner as Example 3-5, except that the borazine-based resin composition 3-4 obtained in Example 3-4 was used instead of the borazine-based resin composition 3-1.

Comparative Example 3-2

(Production of Insulating Film 3-5)

An insulating film 3-5 of the invention was obtained in the same manner as Example 3-5, except that the borazine-based resin composition 3-5 obtained in Comparative Example 3-1 was used instead of the borazine-based resin composition 3-1.

Example 3-9

(Production of Borazine-Based Resin Composition 3-6)

After dissolving 0.1 g (0.50 mmol) of B,B',B"-tris(1'-propynyl)-N,N',N"-trimethylborazine and 0.12 g (0.50 mmol) of 1,3,5,7-tetramethylcyclotetrasitoxane in 4 ml of ethylbenzene, 0.4 g of 5% platinum-alumina (0.1 mmol as platinum) was added as a supported catalyst having the catalyst supported on a compound-based carrier, and the mixture was stirred for 7 days under nitrogen at 50° C. A portion of the reaction solution was sampled and analyzed by gas chromatography (GC), confirming almost complete disappearance of the peaks for the B,B',B"-tris(1'-propynyl)-N,N',N"-trimethylborazine and 1,3,5,7-tetramethylcyclotetrasiloxane monomers. The molecular weight of the product as determined by GPC analysis (based on standard polystyrene) was Mn=7000 (Mw/Mn=5.0). The reaction solution containing the platinum-alumina catalyst was filtered with a disposable membrane filter unit by ADVANTEC (filter mean pore size: 0.5 μm) to obtain a borazine-based resin composition 3-6.

Example 3-10

(Production of Insulating Film 3-6)

An insulating film 3-6 of the invention was obtained in the same manner as Example 3-5, except that the borazine-based resin composition 3-6 obtained in Example 3-9 was used instead of the borazine-based resin composition 3-1.

<Measurement of Specific Dielectric Constant>

The specific dielectric constants of each of the insulating films obtained in the examples and comparative examples were measured. The definition and method of determining the "specific dielectric constant" were the same as for measurement of the film thickness of the insulating film.

Table 4 shows the platinum contents for borazine-based resin compositions 3-1 to 3-3, 3-5 and 3-6. The platinum contents were determined by acid decomposition of a fixed amount of sample and measurement with a model SPQ9000 ICP-MS by Seiko Instruments. Table 5 shows the results of measuring the specific dielectric constants and leak current values for the insulating films 3-1 to 3-3, 3-5 and 3-6.

TABLE 4

| Resin composition | Platinum concentration (ppm) |
|---|---|
| 3-1 (Example 3-1) | 2 |
| 3-2 (Example 3-2) | 1 |

TABLE 4-continued

| Resin composition | Platinum concentration (ppm) |
|---|---|
| 3-3 (Example 3-3) | 5 |
| 3-5 (Comp. Ex. 3-1) | 34 |
| 3-6 (Example 3-9) | 1 |

TABLE 5

| Insulating film | Specific dielectric constant (-) | Leak current (A/cm$^2$) |
|---|---|---|
| 3-1 (Example 3-5) | 2.1 | $1 \times 10^{-10}$ |
| 3-2 (Example 3-6) | 2.1 | $1 \times 10^{-10}$ |
| 3-3 (Example 3-7) | 2.2 | $2 \times 10^{-10}$ |
| 3-5 (Comp. Ex. 3-2) | 2.5 | $8 \times 10^{-10}$ |
| 3-6 (Example 3-10) | 2.2 | $2 \times 10^{-10}$ |

Table 4 demonstrates that the metal impurity (platinum) contents of the borazine-based resin compositions 3-1 to 3-3 and 3-6 which employed supported catalysts as the polymerization catalysts were drastically reduced compared to the untreated composition (the borazine-based resin composition 3-5 obtained in the comparative example). Table 5 demonstrates that the specific dielectric constants and leak currents of the insulating films 3-1 to 3-3 and 3-6 which were formed, respectively, by the borazine-based resin compositions 3-1 to 3-3 and 3-6 having low metallic impurity contents, were adequately reduced compared to the insulating film 3-5 formed by the borazine-based resin composition 3-5.

Example 4-1

(Production of Borazine-Based Resin Composition 4-1)

After dissolving 0.1 g (0.50 mmol) of B,B',B''-triethynyl-N,N',N-trimethylborazine and 0.1 g (0.50 mmol) of p-bis(dimethylsilyl)benzene in 8 ml of ethylbenzene, 10 μl of a solution of platinum-divinyltetramethyldisiloxane in xylene (2% platinum content) was added and the mixture was stirred for 3 days under nitrogen at room temperature. A portion of the reaction solution was sampled and analyzed by gas chromatography (GC), confirming almost complete disappearance of the peak for the B,B',B''-triethynyl-N,N',N''-trimethylborazine monomer and complete disappearance of the peak for the p-bis(dimethylsilyl)benzene monomer.

Figure 6:
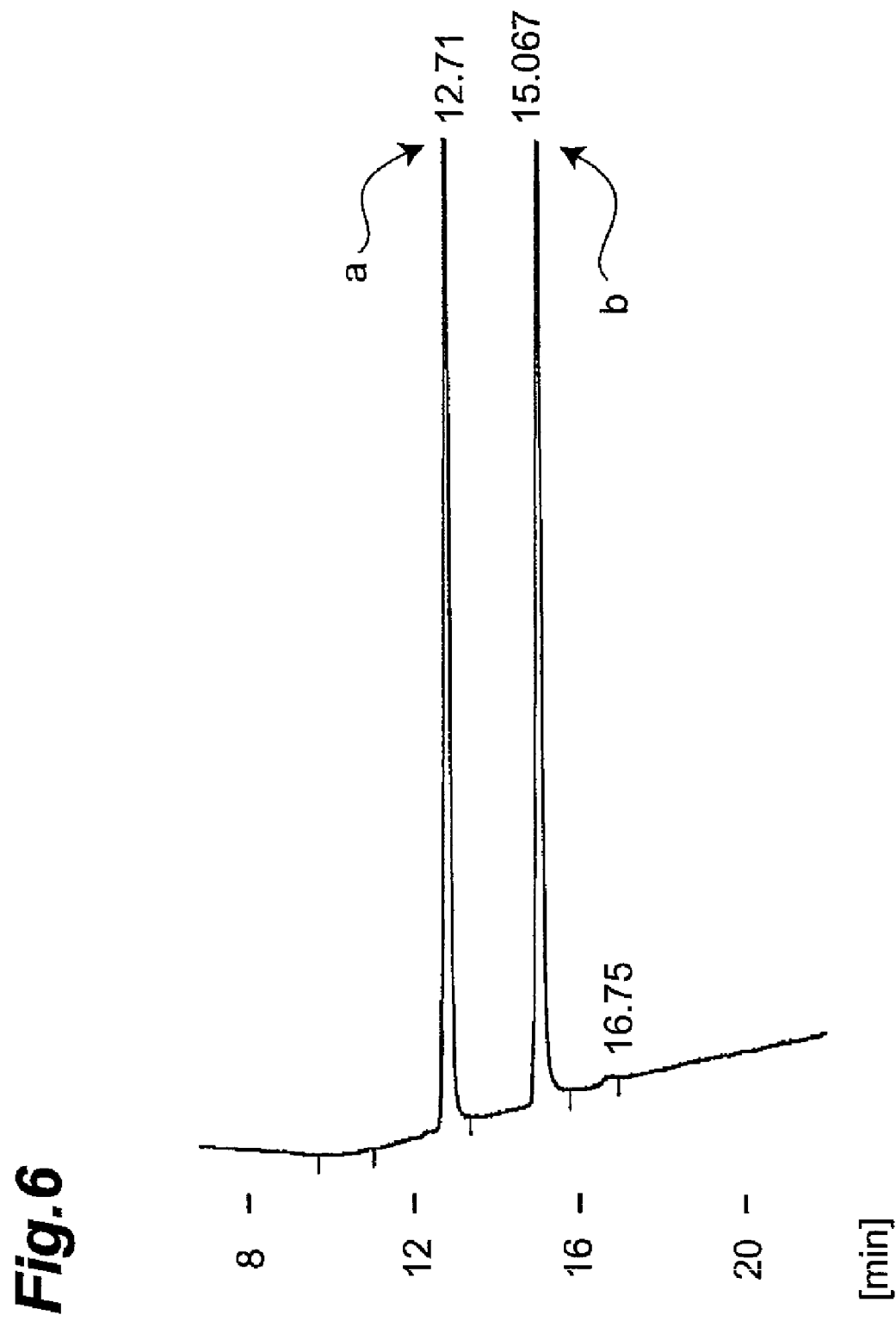
FIG. 6 is a graph showing a gas chromatogram of the reaction solution immediately after start of polymerization in Example 4-1.
Figure 7:
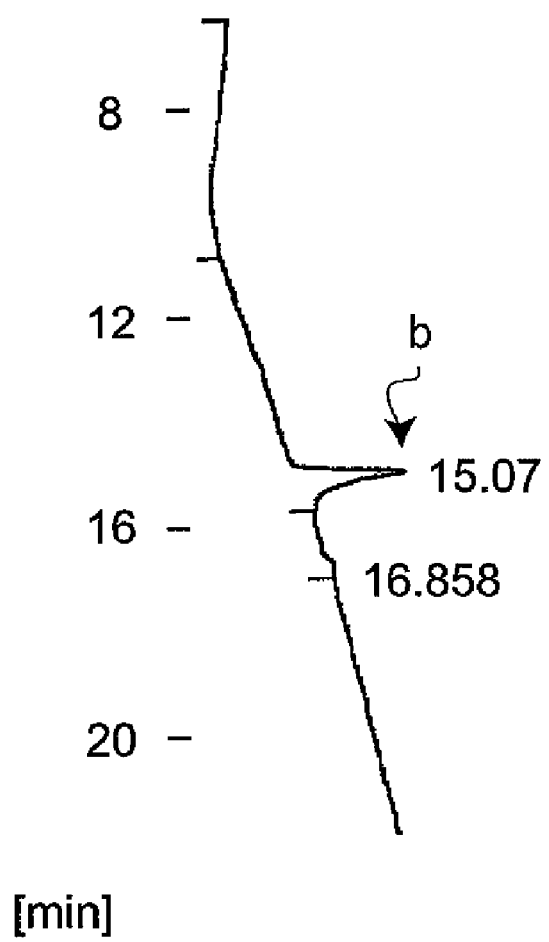
FIG. 7 is a graph showing a gas chromatogram of the reaction solution after 3 days of stirring from the start of polymerization in Example 4-1.

FIG. 6 is a graph showing a gas chromatogram of the reaction solution immediately after start of polymerization, and FIG. 7 is a graph showing a gas chromatogram of the reaction solution after 3 days of stirring from the start of polymerization. The letter "a" in FIG. 6 indicates the peak corresponding to p-bis(dimethylsilyl)benzene, and the letters "b" in FIGS. 6 and 7 indicate the peak corresponding to B,B',B''-triethynyl-N',N''-trimethylborazine.

Figure 8:
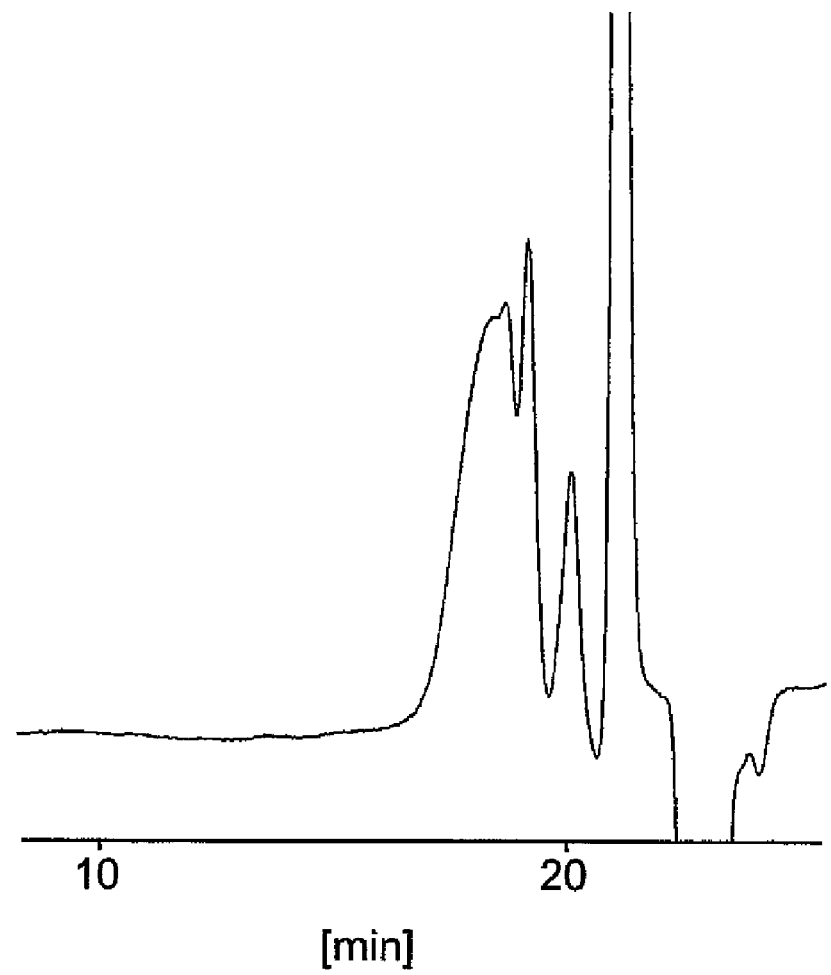
FIG. 8 is a graph showing a GPC chart for the polymer obtained in Example 4-1.

The molecular weight of the product as determined by GPC analysis (based on standard polystyrene) was Mn=4300 (Mw/Mn=2.5). FIG. 8 is a graph showing a GPC chart for the polymer. After then adding 0.2 g of metal scavengers represented by formula (10) (3-(diethylenetriamino)propyl-functionalized silica gel, product of Aldrich) to the reaction solution, it was stirred at room temperature for 2 hours. The platinum-adsorbed metal scavengers were then filtered out with a disposable membrane filter unit by ADVANTEC to obtain a borazine-based resin composition 4-1 according to the invention.

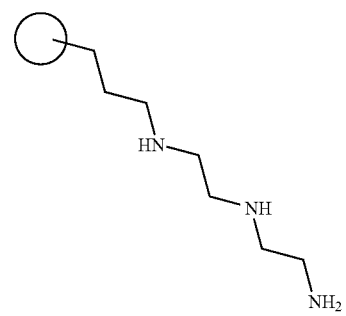

(10)

Example 4-2

(Production of Borazine-Based Resin Composition 4-2)

In the same manner as Example 4-1, B,B',B''-triethynyl-N,N',N''-trimethylborazine and p-bis(dimethylsilyl)benzene were polymerized in the presence of platinum-divinyltetramethyldisiloxane. After then adding 0.2 g of metal scavengers of formula (9) (3-mercaptopropyl-functionalized silica gel, product of Aldrich) to the reaction solution, it was stirred at room temperature for 2 hours. The platinum-adsorbed metal scavengers were filtered out with a disposable membrane filter unit by ADVANTEC to obtain a borazine-based resin composition 4-2 according to the invention.

Example 4-3

(Production of Borazine-Based Resin Composition 4-3)

After dissolving 0.1 g (0.50 mmol) of B,B',B''-triethynyl-N,N',N''-trimethylborazine and 0.12 g (0.50 mmol) of 1,3,5,7-tetramethylcyclotetrasiloxane in 8 ml of ethylbenzene, 10 μl of a solution of platinum-divinyltetramethyldisiloxane in xylene (2% platinum content) was added and the mixture was stirred for 3 days under nitrogen at room temperature. A portion of the reaction solution was sampled and analyzed by gas chromatography (GC), confirming disappearance of the peaks for the B,B',B''-triethynyl-N,N',N''-trimethylborazine and 1,3,5,7-tetramethylcyclotetrasiloxane monomers.

The molecular weight of the product as determined by GPC analysis (based on standard polystyrene) was Mn=4500 (Mw/Mn=2.6). After then adding 0.2 g of metal scavengers represented by formula (8) (3-(diethylenetriamino)propyl-functionalized silica gel, product of Aldrich) to the reaction solution, it was stirred at room temperature for 2 hours. The platinum-adsorbed metal scavengers were then filtered out with a disposable membrane filter unit by ADVANTEC to obtain a borazine-based resin composition 4-3 according to the invention.

Example 4-4

(Production of Borazine-Based Resin Composition 4-4)

In the same manner as Example 4-1, B,B',B''-triethynyl-N,N',N''-trimethylborazine and 1,3,5,7-tetramethylcyclotetrasiloxane were polymerized in the presence of platinum-divinyltetramethyldisiloxane. After then adding 0.2 g of metal scavengers of formula (9) (3-mercaptopropyl-functionalized silica gel, product of Aldrich) to the reaction solution, it was stirred at room temperature for 2 hours. The platinum-adsorbed metal scavengers were filtered out with a disposable membrane filter unit by ADVANTEC to obtain a borazine-based resin composition 4-4 according to the invention.

Example 4-5

(Production of Borazine-Based Resin Composition 4-5)

After dissolving 3.6 g (15 mmol) of B,B',B"-tris(1'-propynyl)-N,N',N"-trimethylborazine and 3.6 g (15 mmol) of 1,3,5,7-tetramethylcyclotetrasiloxane in 150 ml of mesitylene, 30 µl of a solution of platinum-divinyltetramethyldisiloxane in xylene (2% platinum content) was added and the mixture was stirred for 1 day under nitrogen at 40° C. After adding an additional 30 µl of a solution of platinum-divinyltetramethyldisiloxane in xylene (2% platinum content), the mixture was further stirred for 1 day under nitrogen at 40° C. Next, 0.36 g (1.5 mmol) of 1,3,5,7-tetramethylcyclotetrasiloxane was added and stirring was continued for 1 day under nitrogen at 40° C. A portion of the reaction solution was sampled and analyzed by gas chromatography (GC), confirming disappearance of the peaks for the B,B',B"-tris(1'-propynyl)-N,N',N"-trimethylborazine and 1,3,5,7-tetramethylcyclotetrasiloxane monomers.

Figure 9:
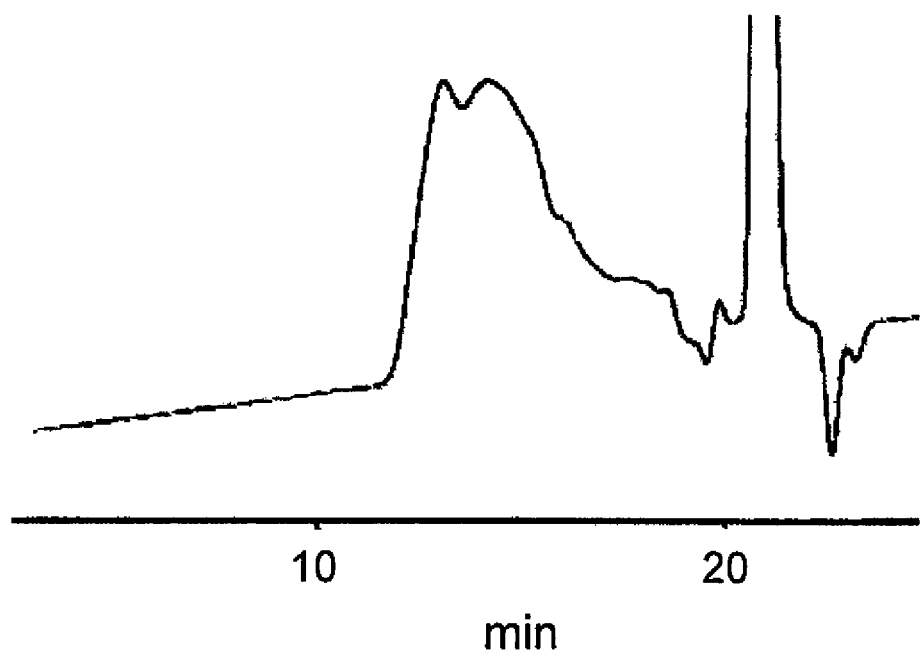
FIG. 9 is a graph showing a GPC chart for the polymer obtained in Example 4-5.

FIG. 9 is a graph showing a GPC chart for the obtained polymer. The molecular weight of the product as determined by GPC analysis (based on standard polystyrene) was Mn=11,000 (Mw/Mn=29).

After then adding 1.0 g of metal scavengers of formula (9) (3-mercaptopropyl functionalized silica gel, product of Aldrich) to the reaction solution, it was stirred at room temperature for 2 hours. The platinum-adsorbed metal scavengers were filtered out on a PTFE membrane filter by ADVANTEC to obtain a borazine-based resin composition 4-5 according to the invention.

Comparative Example 4-1

(Production of Borazine-Based Resin Composition 4-6)

After dissolving 0.1 g (0.50 mmol) of B,B',B"-triethynyl-N,N',N"-trimethylborazine and 0.1 g (0.50 mmol) of p-bis(dimethylsilyl)benzene in 8 ml of ethylbenzene, 10 µl of a solution of the homogeneous metal catalyst platinum-divinyltetramethyldisiloxane in xylene (2% platinum content) was added and the mixture was stirred for 3 days under nitrogen at room temperature. The reaction solution was used as the borazine-based resin composition 4-6.

Comparative Example 4-2

(Production of Borazine-Based Resin Composition 4-7)

After dissolving 0.1 g (0.50 mmol) of B,B',B"-triethynyl-N,N',N"-trimethylborazine and 0.12 g (0.50 mmol) of 1,3,5,7-tetramethylcyclotetrasiloxane in 8 ml of ethylbenzene, 10 µl of a solution of platinum-divinyltetramethyldisiloxane in xylene (2% platinum content) was added and the mixture was stirred for 3 days under nitrogen at room temperature. The reaction solution was used as the borazine-based resin composition 4-7.

Comparative Example 4-3

(Production of Borazine-Based Resin Composition 4-8)

After dissolving 1.2 g (5 mmol) of B,B',B"-tris(1'-propynyl)-N,N',N"-trimethylborazine and 1.2 g (5 mmol) of 1,3,5,7-tetramethylcyclotetrasiloxane in 50 ml of mesitylene, 10 µl of a solution of platinum-divinyltetramethyldisiloxane in xylene (2% platinum content) was added and the mixture was stirred for 1 day under nitrogen at 40° C. After then adding an additional 10 µl of a solution of platinum-divinyltetramethyldisiloxane in xylene (2% platinum content), the mixture was further stirred for 1 day under nitrogen at 40° C. Next, 0.12 g (0.5 mmol) of 1,3,5,7-tetramethylcyclotetrasiloxane was added and stirring was continued for 1 day under nitrogen at 40° C. The reaction solution was used as the borazine-based resin composition 4-8.

Comparative Example 4-6

(Production of Borazine-Based Resin Composition 4-1)

The borazine-based resin composition 4-1 obtained in Production Example 4-1 was filtered through a filter and the filtrate was added dropwise onto a low resistivity silicon wafer (substrate; resistivity<10 Ωcm) for spin coating. The silicon wafer was then heated for 1 hour on a hot plate at 200° C. in a nitrogen atmosphere, and then baked at 300° C. for 30 minutes and at 400° C. for 30 minutes, to obtain an insulating film 4-1 of the invention.

Example 4-7

(Production of Insulating Film 4-2)

An insulating film 4-2 of the invention was obtained in the same manner as Example 4-6 except that the borazine-based resin composition 4-2 obtained in Example 4-2 was used instead of the borazine-based resin composition 4-1.

Example 4-8

Production of Insulating Film 4-3

An insulating film 4-3 of the invention was obtained in the same manner as Example 4-6 except that the borazine-based resin composition 4-3 obtained in Example 4-3 was used instead of the borazine-based resin composition 4-1.

Example 4-9

Production of Insulating Film 4-4

An insulating film 4-4 of the invention was obtained in the same manner as Example 4-6 except that the borazine-based resin composition 4-4 obtained in Example 4-4 was used instead of the borazine-based resin composition 4-1.

Example 4-10

(Production of Insulating Film 4-5)

An insulating film 4-5 of the invention was obtained in the same manner as Example 4-6 except that the borazine-based resin composition 4-5 obtained in Example 4-5 was used instead of the borazine-based resin composition 4-1.

Comparative Example 4-4

(Production of Insulating Film 4-6)

An insulating film 4-6 was obtained in the same manner as Example 4-6 except that the borazine-based resin composition 4-6 obtained in Comparative Example 4-1 was used instead of the borazine-based resin composition 4-1.

Comparative Example 4-5

(Production of Insulating Film 4-7)

An insulating film 4-7 was obtained in the same manner as Example 4-6 except that the borazine-based resin composition 4-7 obtained in Comparative Example 4-2 was used instead of the borazine-based resin composition 4-1.

Comparative Example 4-6

(Production of Insulating Film 4-8)

An insulating film 4-8 was obtained in the same manner as Example 4-6 except that the borazine-based resin composition 4-8 obtained in Comparative Example 4-3 was used instead of the borazine-based resin composition 4-1.

Measurement of Specific Dielectric Constant

The specific dielectric constants of each of the composite insulating films obtained in the examples and comparative examples were measured. The definition and method of determining the "specific dielectric constant" were the same as for measurement of the film thickness of the insulating film.

Table 6 shows the platinum contents for borazine-based resin compositions 4-1 to 4-8. The platinum contents were determined by acid decomposition of a fixed amount of sample and measurement with a model SPQ9000 ICP-MS by Seiko Instruments. Table 7 shows the results of measuring the specific dielectric constants and leak current values for the insulating films 4-1 to 4-8.

TABLE 6

| Borazine-based resin composition | Platinum concentration (ppm) |
|---|---|
| 4-1 (Example 4-1) | 5 |
| 4-2 (Example 4-2) | 3 |
| 4-3 (Example 4-3) | 5 |
| 4-4 (Example 4-4) | 4 |
| 4-5 (Example 4-5) | 2 |
| 4-6 (Comp. Ex. 4-1) | 31 |
| 4-7 (Comp. Ex. 4-2) | 33 |
| 4-8 (Comp. Ex. 4-3) | 32 |

TABLE 7

| Insulating film | Specific dielectric constant (-) | Leak current (A/cm$^2$) |
|---|---|---|
| 4-1 (Example 4-6) | 2.3 | $3 \times 10^{-10}$ |
| 4-2 (Example 4-7) | 2.2 | $2 \times 10^{-10}$ |
| 4-3 (Example 4-8) | 2.3 | $3 \times 10^{-10}$ |
| 4-4 (Example 4-9) | 2.2 | $2 \times 10^{-10}$ |
| 4-5 (Example 4-10) | 2.3 | $1 \times 10^{-10}$ |
| 4-6 (Comp. Ex. 4-4) | 2.5 | $8 \times 10^{-10}$ |
| 4-7 (Comp. Ex. 4-5) | 2.6 | $9 \times 10^{-10}$ |
| 4-8 (Comp. Ex. 4-6) | 2.5 | $9 \times 10^{-10}$ |

Table 6 demonstrates that the platinum contents of the borazine-based resin compositions 4-1 to 4-5 which had been subjected to metal scavenger treatment after polymerization were drastically reduced compared to the untreated compositions (the borazine-based resin compositions 4-6 to 4-8 obtained in the comparative examples). Table 7 demonstrates that the specific dielectric constants and leak currents of the insulating films 1 to 5 which were formed, respectively, by the borazine-based resin compositions 4-1 to 4-5 having low metallic impurity contents, were adequately reduced compared to the insulating films 4-6 to 4-8 formed by the borazine-based resin compositions 4-6 to 4-8.

Industrial Applicability

According to the insulating film A of the invention, the dielectric constant is adequately reduced to result in excellent electrical characteristics, while the lower dielectric constant does not require pore formation so that the mechanical strength can be sufficiently increased. Furthermore, since electronic parts A according to the invention are provided with an insulating film according to the invention, it is possible to effectively prevent wiring delay while enhancing mechanical strength and reliability.

A composite insulating film or electronic part B according to the invention has a second insulating film composed of a compound with a borazine skeleton in the molecular structure on a first insulating film composed of a siloxane resin, and it is therefore possible to achieve an adequately low dielectric constant, increase the mechanical strength and drastically improve adhesion with upper layer films, while also enhancing peel resistance against polishing by CMP or the like (CMP resistance).

According to the first and second borazine-based resin production processes, the borazine-based resin and the borazine-based resin composition of the invention, it is possible to form insulating films having low metallic impurities and satisfactorily inhibited leak current. Also, an insulating film and its production process according to the invention, based on the first and second borazine-based resin production processes, allow leak current to be satisfactorily inhibited while enhancing properties such as heat resistance. In addition, an electronic part C according to the invention also has satisfactorily inhibited leak current and adequately prevents reduction or deterioration of characteristics.

The invention claimed is:

1. A process for production of a borazine-based resin that is a polymer having a borazine skeleton on a main chain or a side chain thereof, wherein the process comprises:

a first step of polymerizing a B,B',B"-trialkynylborazine and a hydrosilane in the presence of a metal catalyst in a polymerization solvent, thereby providing a polymerization system, a second step of adding to the polymerization system a particulate scavenger which is insoluble in the polymerization system of the first step and adsorbs a metal component from the metal catalyst, after completion of the first step, the particulate scavenger being surface-modified particles, and a third step of filtering out the scavenger to which the metal component has been adsorbed after completion of the second step, wherein the particulate scavenger is selected from the group consisting of

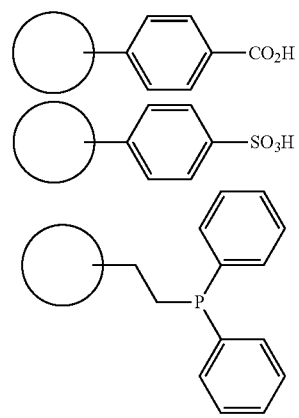

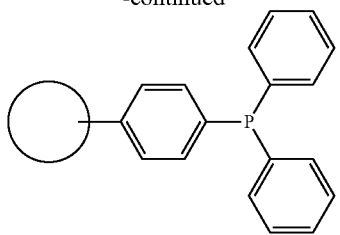

wherein O represents a silica gel, and
wherein amount of the particulate scavenger added is 0.01 to 100 parts by weight with respect to 100 parts by weight of a total of the B, B', B''-trialkynylborazine, the hydrosilane, the metal catalyst and the polymerization solvent, so as to provide a borazine-based resin composition which comprises the borazine-based resin and a solvent therefor, after said third step of filtering out the scavenger, that has an impurity content, of metal from the metal catalyst, of no greater than 30 ppm.

2. A process for production of a borazine-based resin according to claim 1,
wherein the B,B',B''-trialkynylborazine is represented by the following formula (3):

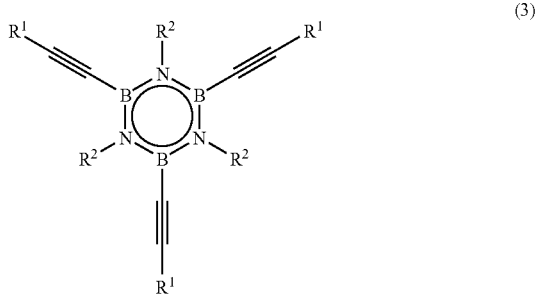

where
$R^1$ represents alkyl, aryl, aralkyl or hydrogen, and
$R^2$ represents alkyl, aryl, aralkyl or hydrogen.

3. A process for production of a borazine-based resin according to claim 1,
wherein the hydrosilane is represented by the following formula (4):

where
$R^3$ and $R^4$ represent identical or different monovalent groups selected from among alkyl, aryl, aralkyl and hydrogen,
$R^5$ represents a substituted or unsubstituted aromatic divalent group, an oxypoly (dimethylsiloxy) group or oxygen,
or by the following formula (5):

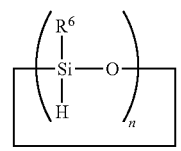

where $R^6$ represents alkyl, aryl, aralkyl or hydrogen, and n represents an integer of 2 or greater.

4. A process for production of a borazine-based resin according to claim 1,
wherein in the second step, the particulate scavenger coordinates with the metal component from the metal catalyst.

5. A process for production of a borazine-based resin according to claim 1, wherein the particulate scavenger onto which the metal component has been adsorbed is particulate and insoluble in the polymerization solvent.

6. A process for production of a borazine-based resin according to claim 1, wherein the second step includes stirring the polymerization solvent.

7. A process for production of a borazine-based resin according to claim 1,
wherein the amount of the particulate scavenger added is 0.1 to 10 parts by weight with respect to 100 parts by weight of a total of the B,B',B''-trialkynylborazine, the hydrosilane, the metal catalyst and the polymerization solvent.

8. A process for production of a borazine-based resin according to claim 1,
wherein in said first step, said catalyst is present in an amount of 0.000001-5 as a molar ratio of metal atoms of the catalyst with respect to a starting material compound present in smaller molar amount between the B,B',B''-trialkynylborazine compound and the hydrosilane.

* * * * *